(12) United States Patent
Laetsch

(10) Patent No.: US 6,798,878 B2
(45) Date of Patent: Sep. 28, 2004

(54) LOCAL LOOP TELECOMMUNICATION REPEATER HOUSING HAVING MOUNTING SLOTS ENABLING REPLACEABLE REPEATER AND VOLTAGE PROTECTOR ASSEMBLIES

(75) Inventor: Erich K. Laetsch, Reno, NV (US)

(73) Assignee: Anacapa Technology, Inc., Reno, NV (US)

( * ) Notice: Subject to any disclaimer, the term of this patent is extended or adjusted under 35 U.S.C. 154(b) by 0 days.

(21) Appl. No.: 10/304,795

(22) Filed: Nov. 26, 2002

(65) Prior Publication Data

US 2003/0156708 A1 Aug. 21, 2003

Related U.S. Application Data

(63) Continuation of application No. 09/952,547, filed on Sep. 14, 2001, now Pat. No. 6,510,223, which is a continuation of application No. 08/965,630, filed on Nov. 6, 1997, now Pat. No. 6,292,556.

(51) Int. Cl.$^7$ ............................................. H04M 7/00
(52) U.S. Cl. ...................................... 379/338; 361/730
(58) Field of Search ................................ 379/338, 348; 361/730, 728, 829, 831

(56) References Cited

U.S. PATENT DOCUMENTS

| | | | |
|---|---|---|---|
| 2,796,559 A | 6/1957 | Feucht | 317/100 |
| 2,833,966 A | 5/1958 | Goodier et al. | 317/101 |
| 2,876,277 A | 3/1959 | Badger et al. | 174/52 |

(List continued on next page.)

FOREIGN PATENT DOCUMENTS

| | | |
|---|---|---|
| GB | 2193552 A | 2/1988 |
| JP | 357102058 A | 6/1982 |
| JP | 360079834 A | 5/1985 |
| JP | 408065868 A | 3/1996 |

OTHER PUBLICATIONS

HDRAC Engineering Prototype photographs, Version 2, Nos. 1–4, Aug. 1996.
Special Product Company, Heat Dissipation Practices, Jun. 18, 1996, Signed Randall Hutchison.
Special Product Company, Drawing, Jun. 18, 1996, Signed Randall Hutchison.
ADC Telecommunications, Inc.; Sonoplex® Radiator™ II Housing Installation Instructions; ADCP–70–650, Issue 1, pp. 1–21 (Apr. 1999).
Special Product Company; 7000 Series Sixteen Slot Generation 2 Universal Remote Enclosure—Technical Specifications; Publication B7000–16–GEN2–DOC, Issue C, pp. 1–49 (Dec. 8, 2000).
SPC Corporation; Radial Slot Enclosure (HDSL2), pp. SPC 000557—SPC 000559 (Feb. 5, 2000).
AT&T Practice, Standard, AT&T 640–525–212, Issue 4, Feb. 1985; "475G2, 475J, and 475K Apparatus Cases, Description, Installation, Splicing and Maintenance" pp. 1–37.
AT&T Practice, Standard, AT&T 640–527–107, Issue 3, Mar. 1987; "479–Type Apparatus Cases, Description, Installation, Splicing and Maintenance" pp. 1–47.

(List continued on next page.)

Primary Examiner—F. W. Isen
Assistant Examiner—Donald L. Storm
(74) Attorney, Agent, or Firm—Westman, Champlin & Kelly, P.A.

(57) ABSTRACT

A design for passively cooled telecommunication repeater housings for use in wire transmission in the local loop outside plant provides mounting slots for repeaters and voltage protector assemblies disposed and arranged such that a repeater and its voltage protector assembly can be removed independently of each other by pulling either one in the same direction.

12 Claims, 21 Drawing Sheets

U.S. PATENT DOCUMENTS

| | | | |
|---|---|---|---|
| 3,087,095 A | | 4/1963 | McConkey, Jr. et al. ... 317/101 |
| 3,845,253 A | | 10/1974 | Hanneman et al. ......... 179/179 |
| 3,961,226 A | * | 6/1976 | Hoffman et al. ............ 361/119 |
| 3,991,288 A | | 11/1976 | George et al. .............. 179/179 |
| 3,997,819 A | | 12/1976 | Eggert et al. ............... 317/100 |
| 4,015,745 A | | 4/1977 | Petrangelo .................. 220/320 |
| 4,071,876 A | * | 1/1978 | Benson et al. .............. 361/119 |
| 4,226,281 A | | 10/1980 | Chu ........................ 165/80 A |
| 4,277,812 A | | 7/1981 | Jones ......................... 361/119 |
| 4,315,300 A | | 2/1982 | Parmerlee et al. .......... 361/382 |
| 4,447,856 A | | 5/1984 | Takahashi et al. .......... 361/383 |
| 4,449,576 A | | 5/1984 | Baum et al. ........... 165/104.33 |
| 4,465,899 A | | 8/1984 | Mauclere et al. ......... 174/52 R |
| 4,514,746 A | | 4/1985 | Lündqvist ................... 361/385 |
| 4,528,615 A | | 7/1985 | Perry ......................... 361/386 |
| 4,549,602 A | | 10/1985 | Espinoza .................. 165/80.2 |
| 4,662,002 A | | 4/1987 | Davis et al. ................. 455/601 |
| 4,679,250 A | | 7/1987 | Davis et al. ................. 455/601 |
| 4,763,224 A | | 8/1988 | Bentz et al. ................ 361/386 |
| 4,858,068 A | | 8/1989 | Bitller et al. ............... 361/380 |
| 4,935,845 A | | 6/1990 | SchweHr et al. ........... 361/384 |
| 4,962,445 A | | 10/1990 | Pelet et al. ................. 361/386 |
| 5,045,971 A | | 9/1991 | Ono et al. ................... 361/386 |
| 5,060,115 A | | 10/1991 | Sewell ....................... 361/388 |
| 5,105,337 A | | 4/1992 | Bitller et al. ............... 361/386 |
| 5,121,290 A | | 6/1992 | Azar .......................... 361/384 |
| 5,243,131 A | | 9/1993 | Jakob et al. ................ 174/52.1 |
| 5,251,099 A | | 10/1993 | Goss et al. .................. 361/721 |
| 5,309,315 A | | 5/1994 | Naedel et al. .............. 361/704 |
| 5,329,425 A | | 7/1994 | Leyssens et al. ........... 361/701 |
| 5,343,358 A | | 8/1994 | Hilbrink ..................... 361/700 |
| 5,398,161 A | | 3/1995 | Roy ........................... 361/727 |
| 5,450,272 A | | 9/1995 | Van Gaal et al. ........... 361/690 |
| 5,515,912 A | | 5/1996 | Daikoku et al. ........... 165/80.4 |
| 5,777,846 A | | 7/1998 | Hayes et al. ................ 361/690 |
| 5,842,514 A | | 12/1998 | Zapach et al. ......... 165/104.33 |
| 5,844,777 A | | 12/1998 | Gates ......................... 361/700 |
| 5,883,784 A | | 3/1999 | Hughes et al. .............. 361/707 |
| 5,896,268 A | | 4/1999 | Beavers ...................... 361/690 |
| 5,930,113 A | | 7/1999 | McCann ..................... 361/704 |
| 5,943,219 A | | 8/1999 | Bellino et al. .............. 361/816 |
| 5,949,650 A | | 9/1999 | Bulante et al. .............. 361/704 |
| 6,025,991 A | | 2/2000 | Saito .......................... 361/704 |
| 6,028,769 A | * | 2/2000 | Zurek ......................... 361/704 |
| 6,046,908 A | | 4/2000 | Feng .......................... 361/707 |
| 6,055,157 A | | 4/2000 | Bartilson .................... 361/699 |
| 6,065,530 A | | 5/2000 | Austin et al. .............. 165/80.3 |
| 6,104,611 A | | 8/2000 | Glover et al. ............... 361/700 |
| 6,118,662 A | | 9/2000 | Hutchison et al. .......... 361/704 |
| 6,244,332 B1 | | 6/2001 | Gesklin et al. ............ 165/80.3 |
| 6,252,775 B1 | | 6/2001 | Kuroda ...................... 361/707 |
| 6,292,556 B1 | | 9/2001 | Laetsch ...................... 379/338 |
| 6,310,772 B1 | | 10/2001 | Hutchison et al. .......... 361/700 |
| 6,404,637 B2 | | 6/2002 | Hutchison et al. .......... 361/704 |
| 6,430,044 B2 | | 8/2002 | Hutchinson et al. ........ 361/690 |
| 6,507,494 B1 | | 1/2003 | Hutchison et al. .......... 361/704 |
| 6,611,426 B2 | | 8/2003 | Hutchison et al. .......... 361/690 |
| 6,625,017 B1 | | 9/2003 | Lin et al. .................... 361/690 |
| 2002/0008964 A1 | | 1/2002 | Hutchison et al. .......... 361/724 |

OTHER PUBLICATIONS

Bell System Practices, AT&T Co Standard; Section 640–525–308; Issue 2, Sep. 1980; "809–Type Repeater Cases; Description, Installation, Splicing and Maintenance" pp. 1–23.

AT&T Practice, Standard; AT&T 640–525–307, Issue 5, Apr. 1986; "818/819–Type Repeater Cases, Description, Installation, Splicing, and Maintenance, T1, T1C, T1D, T1G and T1/OS Carrier Systems" pp. 1–69.

Special Product Company, Product Sheet, 1996.

\* cited by examiner

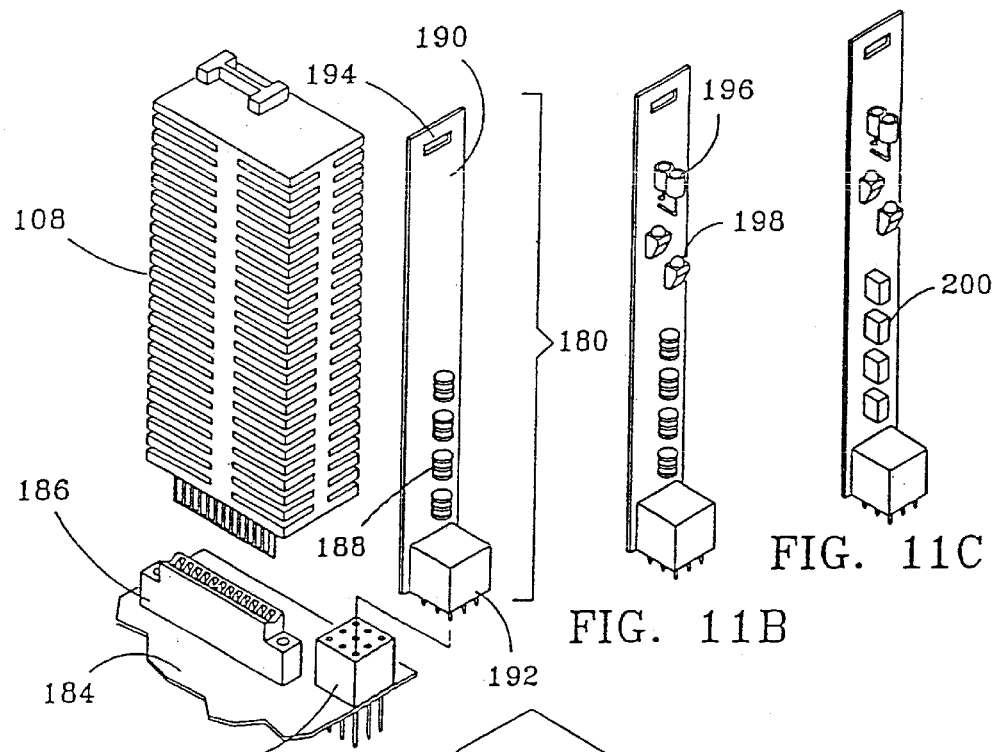
FIG. 11A
FIG. 11B
FIG. 11C
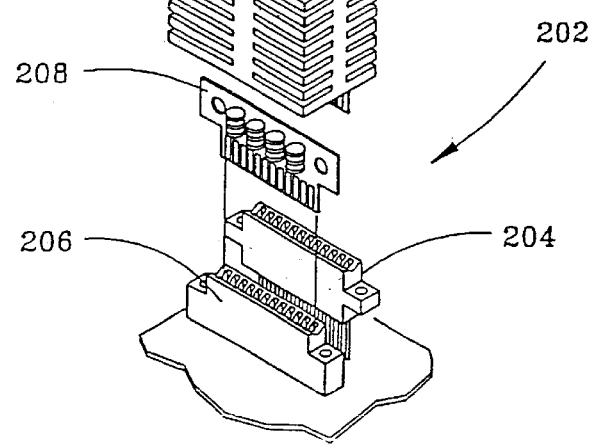
FIG. 11D

LOCAL LOOP TELECOMMUNICATION REPEATER HOUSING HAVING MOUNTING SLOTS ENABLING REPLACEABLE REPEATER AND VOLTAGE PROTECTOR ASSEMBLIES

CROSS-REFERENCE OF RELATED APPLICATIONS

This is a continuation of, and claims priority under 35 U.S.C. §120, U.S. application Ser. No. 09/952,547, tiled Sep. 14, 2001, now issued as U.S. Pat. No. 6,510,223 which is a continuation of U.S. application Ser. No. 08/965,630, filed Nov. 6, 1997, now issued as U.S. Pat. No. 6,292,556, the content of which is hereby incorporated by reference in its entirety.

BACKGROUND OF THE INVENTION

1. Field of the Invention

This invention relates to passively cooled repeater housings for use in a telecommunication network's wire transmission local loop outside plant and more specifically to repeater housings having improved thermal transfer characteristics, improved performance under solar loads and direct access to repeaters and voltage surge protectors.

2. Description of the Related Art

In the telecommunications industry, voice, data and video transmission signals are transmitted over wire, fiber optic and wireless networks. Although the fiber optic and wireless networks were designed to meet the current demand for high speed signal transmission, the massive investment in the wire network, or the "copper plant" as it is commonly referred to, necessitates its continued use. The cost and time involved to completely replace the millions, if not billions, of miles of copper (or aluminum) wires in the United States alone with fiber optic lines and wireless networks is prohibitive. Although originally designed to carry only voice grade signals, the continued development of increasingly sophisticated digital signal processing (DSP) techniques such as T-carrier, ISDN, Direct Digital Service (DDS) and most recently, High bit-rate-Digital Subscriber Line (HDSL) allow the telecommunications industry to transmit rapidly growing volumes of high speed signals over the copper plant in a more cost effective manner than conversion to the newer transmission technologies in all but the high volume networks.

As shown in FIG. 1, a typical telecom network 10 includes number of central offices 12 that transmit a massive amount of very high speed signals between offices over inter-office trunks 14 and a number of local loops 16 that distribute portions of the signals from a central office 12 to a customer premises 18 and between customer premises 18. A clear distinction has existed between the offices' inter-office trunks 14 and the local loops 16. First, each central office will typically service many user premises. As a result, the cost of replacing the copper plant for the central offices' inter-office trunks is much lower than replacing it for all the individual users. Second, the signal traffic between central offices is typically much higher volume and much higher speed than is required, in the local loop.

As a result, inter-office trunks 14 have bean largely converted from copper wire to the more sophisticated fiber optics, microwave transmission and even satellite transmission systems while the local loops have used the updated DSP technologies in conjunction with the existing and even new installation copper 20. However, for the last several years, the explosive growth in demand for high speed telecommunications services such as those required for business networking and the Internet has been stressing the capabilities of the copper network in the local loop.

One particular area in which the copper network is being stressed occurs in the "outside plant", i.e. that part of the local loop that lies outside the controlled environments of telecom or user buildings, generally regarded as the lowest technology link in the network and symbolized by the lineman on a pole or in a manhole.

As signals are transmitted over the copper wires in the outside plant they degrade and lose signal integrity. As a result, the industry has developed circuits called "mid-span repeaters" or simply "repeaters" that regenerate a degraded signal. Depending upon the transmission technology used, the repeaters are placed every three to twelve thousand feet along the transmission path.

Repeaters are manufactured by numerous suppliers to support a variety of copper transmission technologies. Several industry standard connector and case standards are followed to allow repeaters from different suppliers and of different technologies to be interchanged. FIGS. 2a and 2b illustrate a standard 239 mini-repeater 22 often used with older T-1 technology and a standard 239 double-wide repeater 24 that is commonly used with the ISDN, DDS and HDSL technologies. The T-1 239 mini-repeater generates approximately 0.75 watts of waste heat whereas an HDSL 239 double-wide, while only twice as big, generates up to 6 watts of waste heat. Because of the nearly order of magnitude increase in power consumption, the 239 double-wide is frequently provided with slits that facilitate air flow over the hot parts to convectively remove heat. The power consumption of ISDN and DDS repeaters is also substantially greater than T-1 239 mini-repeaters, but less than that of the more sophisticated HDSL repeaters.

Because mid-span repeaters are used in the outside plant, frequently in manholes 28, they must be placed in a repeater housing 26 such as the AT&T '809 Apparatus Case 30 shown in FIGS. 3a and 3b, the SPC Series 7000 Enclosure 32 shown in FIGS. 3c and 3d, or the generic cabinet style enclosure 34 shown in FIG. 3e. The primary function of these known repeater housings is to provide an environmental enclosure that shields the repeaters from the elements; wind, rain, dust, solar energy, animals, vandals etc. They are oftentimes formed from strong corrosion resistant materials such as stainless steel or hard plastic and are hermetically sealed, often under a positive pressure. In mild environments the repeater housing do not have be corrosion resistant and above ground cases are often vented.

The housings must accommodate standard sized repeater modules that are built by a number of vendors. The housings must also provide physical access to repeater modules and voltage surge protectors so that they can be removed and replaced in the field in a "plug-in" manner without having to disassemble the module or disturb the operation of other repeaters. Furthermore, to improve reliability and avoid the expense of requiring electrical power at each repeater site, the housing must be passively cooled to remove the waste heat generated by the repeaters. It is well understood in the telecommunications industry that thermal stress can cause short term failures, intermittent operation deviations and significantly shorten the life of electronic equipment. Most telecom electronics is installed in buildings that provide a controlled and relatively benign thermal environment In contrast, repeaters deployed in the outside plant must work in the harsh, natural environment.

The AT&T '809 apparatus case 30 shown in detail in FIG. 4 and the double size '819 apparatus case described in AT&T Practice 640-525-307 Issue 5 April 1986 is a molded plastic rectangular housing that is lightweight, does not corrode, and optimizes the use of available space. The '819 obsoleted AT&T's earlier '479 apparatus case described in AT&T Practice 640-527-107 Issue 3, March 1986 that had the same general shape but was constructed from cast iron, and thus extremely heavy and subject to corrosion.

The '809 includes a molded base 36 for receiving a stub cable 38 from a splice case in the local loop and a mounting bracket 40 for mounting the case on the wall of a manhole, for example. Pressure and pressure relief valves are also provided in the base. Stub cable 38 is split into individual wires that are run through base 36 and wire-wrapped to the backside of repeater/protector connectors 42, which have a female PCB edge connector 44 for mounting the repeater module and multiple sockets. 46 for mounting gas tube style voltage surge protectors 48.

A molded housing 50 having an array of plastic stubs 52 is bolted on base 36 so that stubs 52 define slots 54 over the respective repeater/protector connectors 42 for separating and supporting the repeater modules. A molded cover 56 is then bolted on top of housing 50. The cover can be removed to gain direct access to the top of the enclosed repeater modules for easy installation and replacement. The illustrated '809 case is designed, physically and electrically, to hold 12 239 mini-repeater modules 22 or 6 non-standard repeater modules 25 with 2 slots used for support functions. The '809 case was designed for the 239 mini-repeater and thus does not physically accommodate the standard 239 double-wide case. Some suppliers have developed a variation of the 239 double-wide that is even wider and has slots 58 in the case to allow it to fit into two slots in the '809 and '819.

To make the best use of the space available inside housing 50, voltage surge protectors 48 are positioned in connector sockets underneath the repeater modules. To gain access to the protectors, a lineman must first remove the repeater module, taking it out of service temporarily. Because the voltage surge protectors are positioned at the bottom of narrow slots 54 they can be very difficult to remove. Consequently, AT&T provides a special 829A tool and a detailed multi-step process for extracting the gas protectors. In practice, lineman sometimes use a long screwdriver to pop the protectors loose. However, with +/− 130 volts active on the contacts of the protector sockets, attempted service without the proper tool can be hazardous, both to the lineman and to the equipment.

Although the practice makes no mention of thermal considerations, the '809 relies on convection and, to a lesser degree, radiation to remove waste heat from the repeater modules. The repeater module and, in the case of the slit, modified double-wide, the components themselves heat the air which transfers some heat to the adjacent walls of the case and rises to convectively transfer the rest of the heat to the top of the case. The walls and end of the case absorb the waste heat and then convectively transfer it to the surrounding environment. Notice, stubs 52 position, but do not tightly enclose the repeater modules to encourage air flow to improve convective heat transfer to the top of the case.

The SPC 7000 Series enclosure 32 shown in FIGS. 5 and 6 is a thin-walled stainless steel cylindrical enclosure. The 7000 Series enclosure includes a cylindrical base 60 into which it receives a stub cable 62. A lightweight thin aluminum basket 64 is centrally mounted on a bracket 66 in base 60. A number of female PCB repeater connectors 68 are mounted in slots in the; bottom of the basket with their pins 70 wire wrapped (not shown) to the stub cable. A voltage surge protector assembly 72 is then mounted on the back side of connector 68 and repeater modules 24 are mounted on the top side in the basket. Bracket 66 allows basket 64 to be tipped to access the backside wiring. Alternately, the basket can be replaced with a chassis in which the modules are inserted horizontally from one side and access to the protectors is gained from the other side. A dome 74 fits over base 60 and is hermetically sealed using a V-groove clamp 76, an O-ring 78a and an O-ring retainer 78b Similar to the '819, the Series 7000 enclosure relies on radiation and convection to move the waste heat generated by the repeater modules to the dome and then to the surrounding environment. To this end, the 239 double-wide repeater modules and the basket are formed with slits to encourage air flow. In its normal upright position, the heated air rises to the top of the dome where it is then convectively transferred to the environment.

Access to the repeater is gained by removing the entire cylindrical dome. The removal of the entire cylindrical dome of an SPC 7000 style repeater housing is of little consequence in above ground and low density below ground (manhole) installations, however, with sharply increased crowding in below ground facilities, the extra clearance required to remove the entire dome has become a drawback to the otherwise satisfactory cylindrical dome repeater housing configuration. In response, repeater housing mounting brackets have been developed that allow the entire housing to pivot away from the mounting surface sufficiently to permit the cylindrical dome to be removed without requiring excessive vertical clearance directly above its installation.

While such access to the modules and voltage protectors may seem convenient, in the reality of a crowded manhole, "tilt, swivel and around the back" represent difficult access, excessive installation and service time and risk to the hundreds of wires connected to the repeater modules. Furthermore, the +/−130 VDC span power is not deactivated during service of the repeater housing, therefore, installation and removal of the voltage protector assemblies connected to this voltage must be performed with serious caution.

The '819 apparatus case and Series 7000 enclosure, and the thermal transfer techniques they embody, are designed to handle up to 25 239 mini-repeaters and do so with no problem. However, those same housings are limited to 2 or maybe 3 HDSL repeaters before their thermal transfer capabilities are overloaded. With the demand for high bandwidth service continuing to grow and the amount of available space either below ground in manholes or above ground reaching or exceeding capacity, repeater housings in which a majority of the slots must remain empty for thermal reasons is clearly a problem. Furthermore, direct, easy and safe access to the repeater modules and their voltage surge protectors is an important consideration.

SUMMARY OF THE INVENTION

In view of the above problems, the present invention provides an improved thermal design based upon solid thermal conduction for passively cooled repeater housings used in a telecommunication network's wire transmission local loop outside plant.

This is, accomplished by using thermal collection, transfer and distribution members to collect the repeater modules' waste heat through respective thermal interfaces, transfer the waste heat along respective thermal conduction paths to the environmental enclosure, and then distribute the waste heat over a substantial portion of the enclosure's available surface area to form an enlarged thermal interface for convectively transferring the waste heat to the ambient air. In a currently preferred approach, the collection, transfer and distribution functions are integrated in a thermal sleeve that minimizes the thermal resistance between the module and the enclosure. To further improve heat transfer, the distribution member and enclosure are preferably formed to distribute the waste heat over an expanded external surface area. This is accomplished by designing the repeater and voltage protector assemblies so that they can be removed via top/front access, preferably independently of each other. This allows the distribution members to be fabricated in permanent and intimate thermal contact with the enclosure by, for example, compression fitting complementary corrugation pieces or molding one inside the other.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 11a through 11d illustrate different embodiments of a voltage surge protector assembly for the repeater that facilitate direct access within the repeater housing;

DETAILED DESCRIPTION OF THE INVENTION

Figure 1:
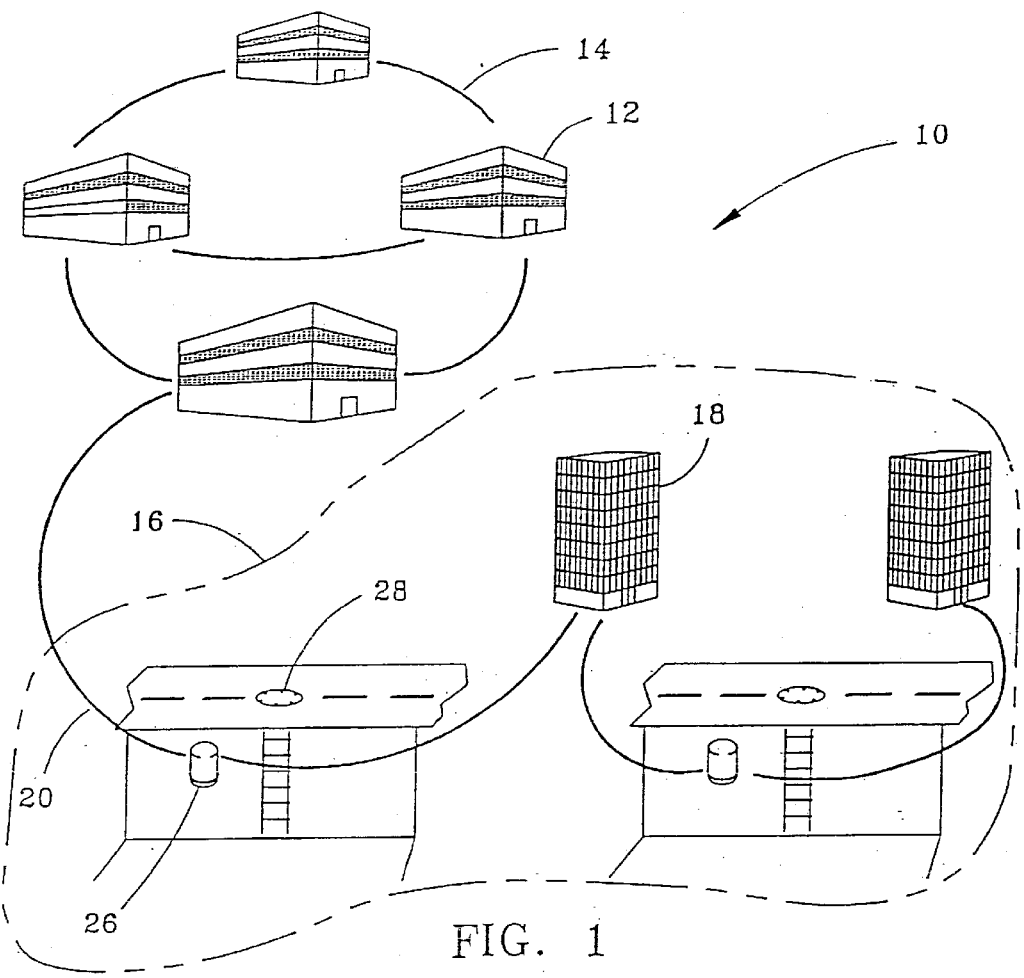
FIG. 1, as described above, is a simplified illustration of a telecommunications network.
Figure 2A:
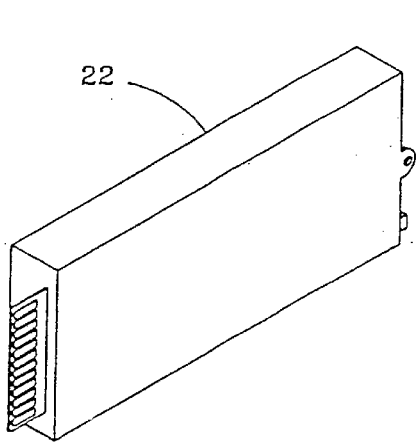
FIGS. 2a and 2b, as described above, depict a standard 239-mini repeater and a standard 239 double-wide repeater case, respectively.
Figure 2B:
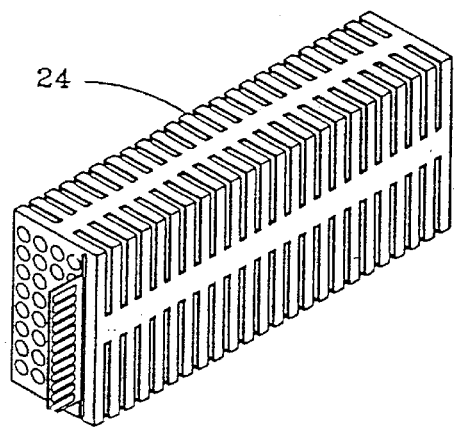
Figure 3A:
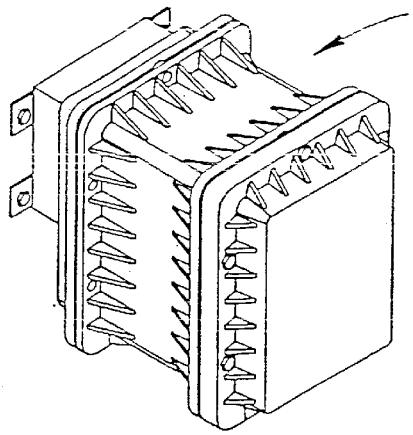
FIGS. 3a through 3e, as described above, depict a variety of known repeater housings.
Figure 3B:
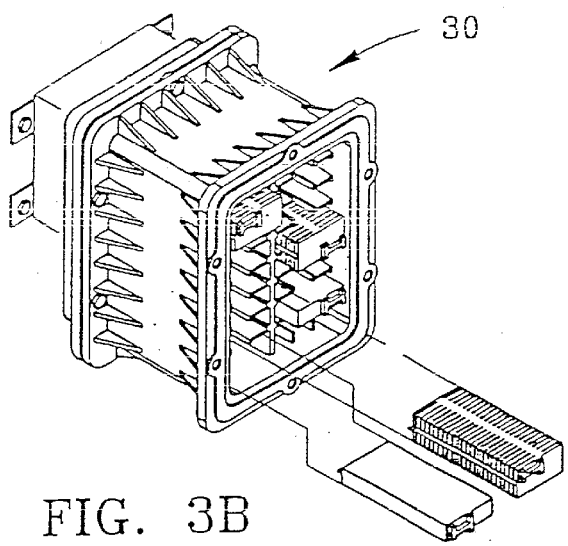
Figure 3C:
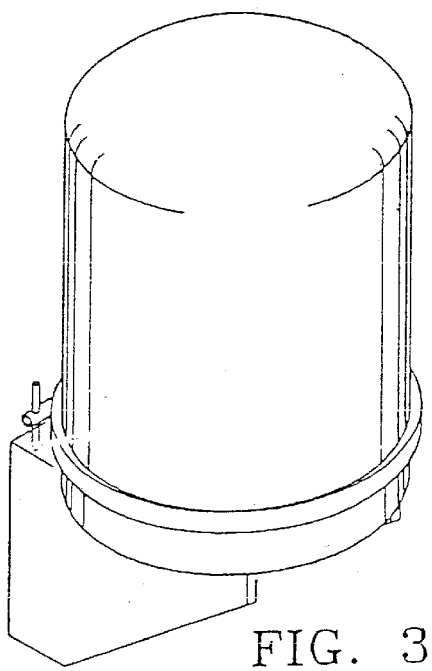
Figure 3D:
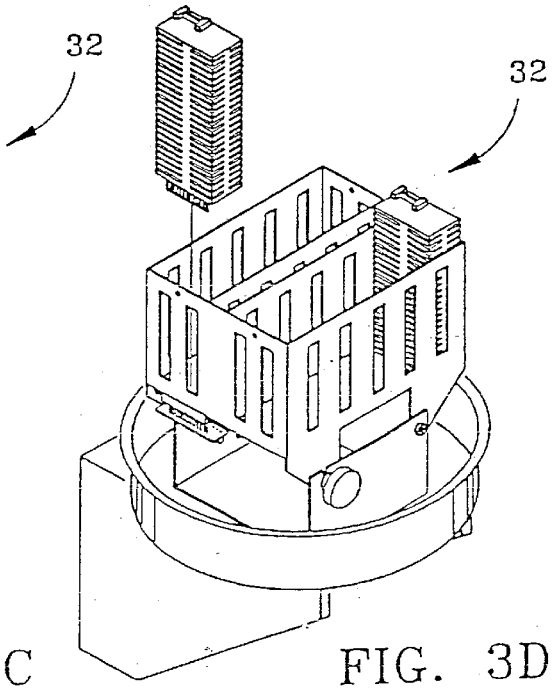
Figure 3E:
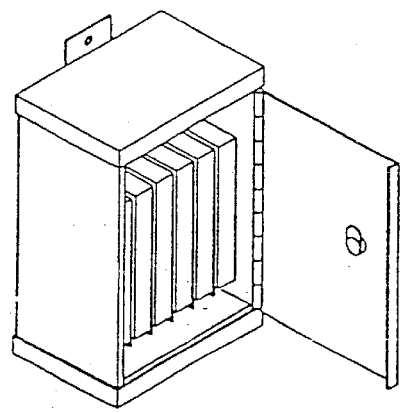
Figure 4:
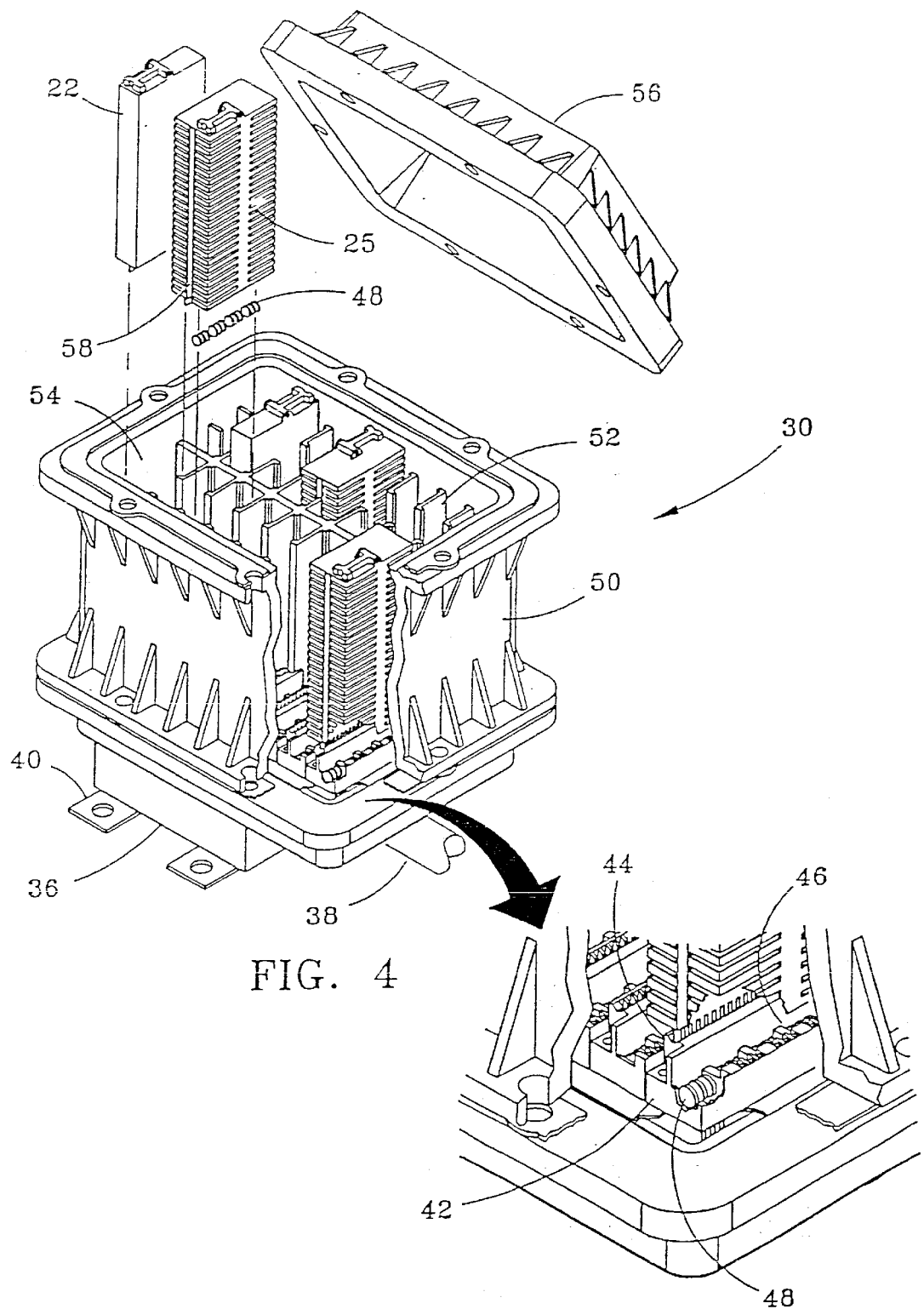
FIG. 4, as described above, is a perspective and partially cut-away view of an AT&T '809 apparatus case.
Figure 5:
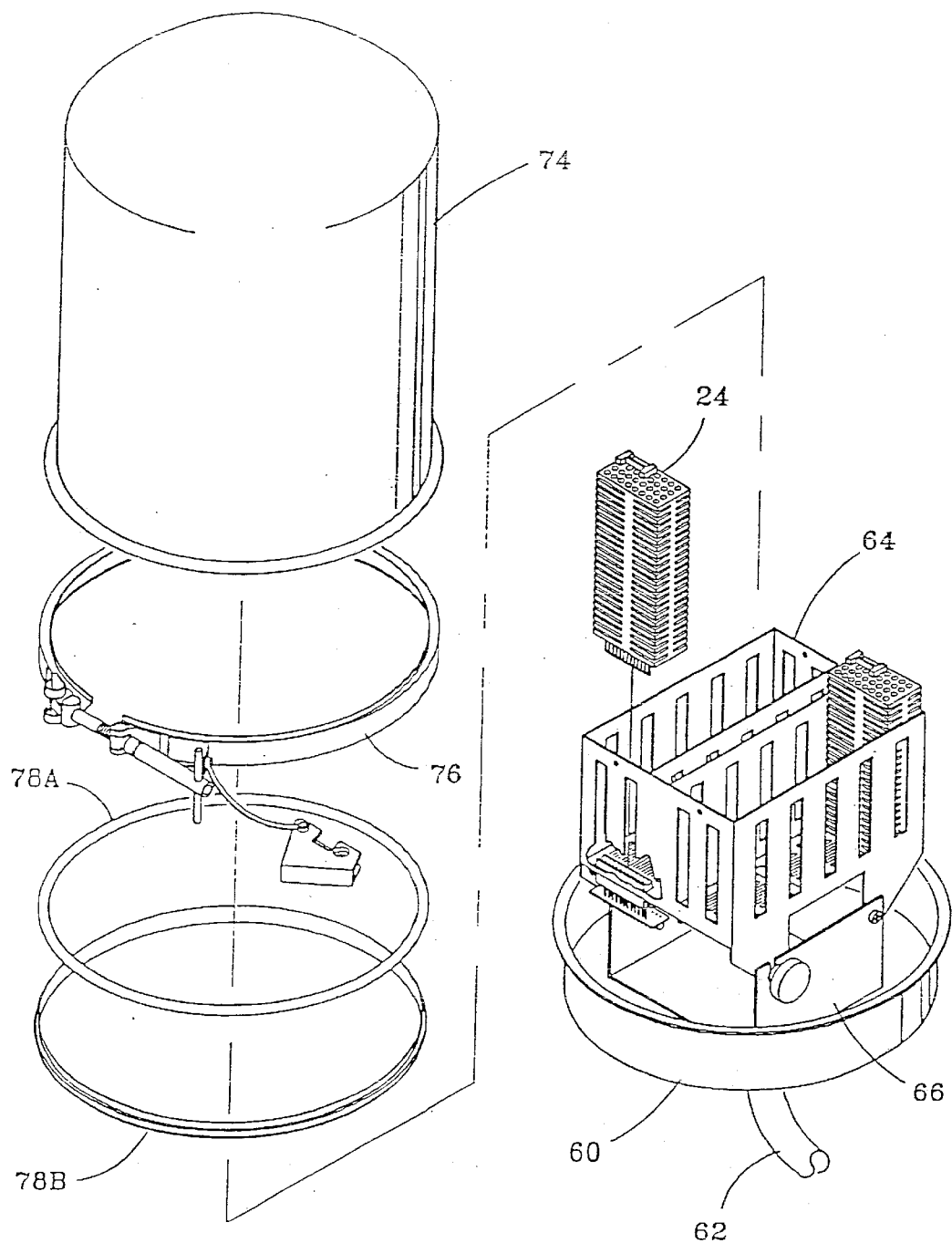
FIG. 5, as described above, is an exploded view of an SPC 7000 series repeater housing.
Figure 6:
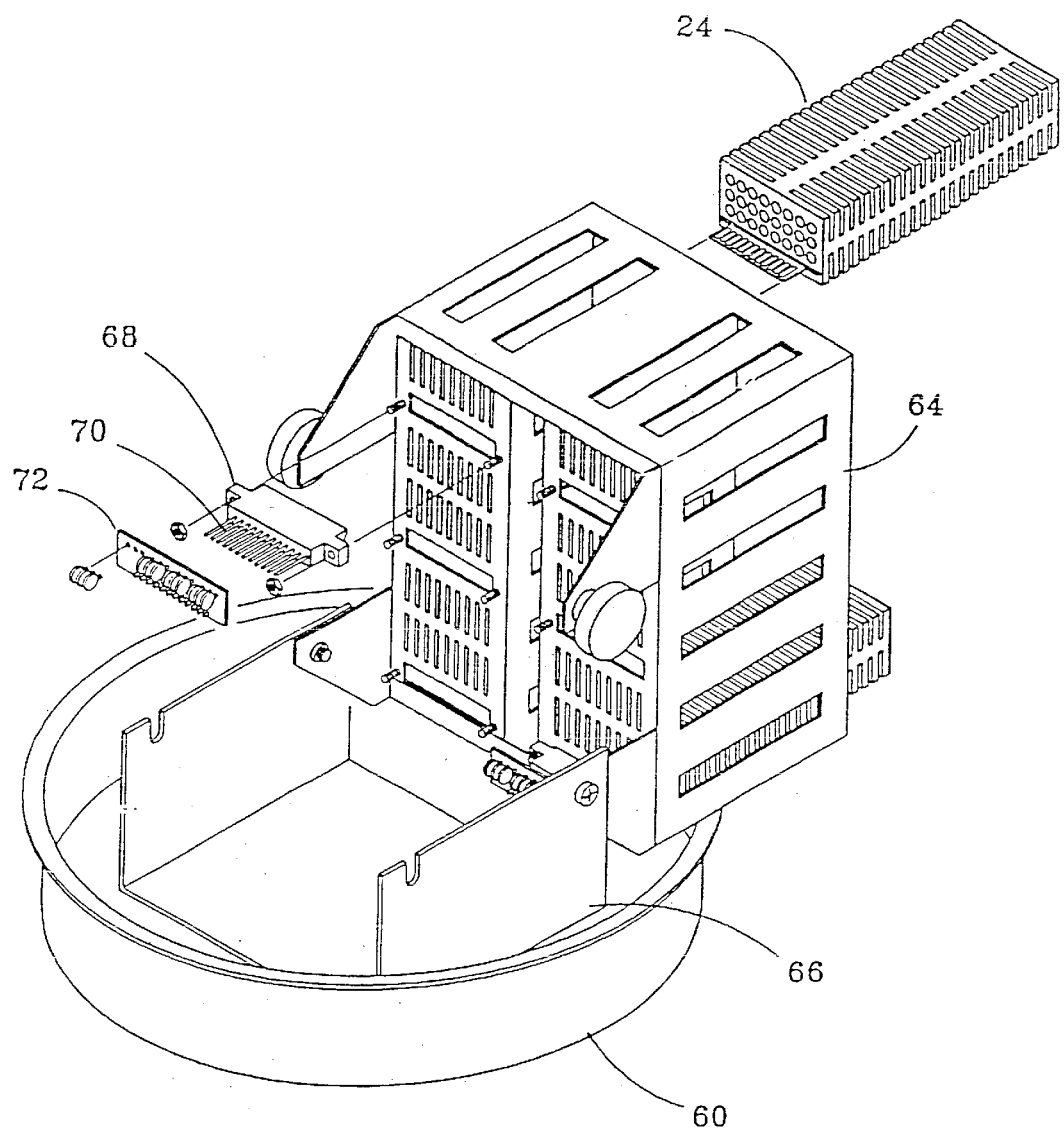
FIG. 6, as described above, is a tipped view of the SPC 7000 series repeater housing.
Figure 7:
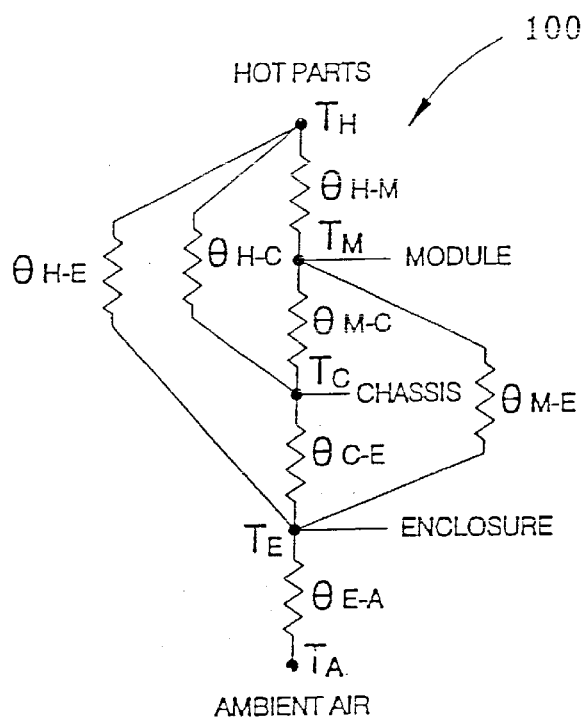
FIG. 7 is a thermal resistance model of a repeater housing.

The present invention applies thermal modeling and design principles to first identify and then solve the thermal transfer problems in known local loop repeater housings. As the very simplified thermal model 100 for the known repeater housings shown in FIG. 7 illustrates, waste heat generated by the aggregation of "HOT PARTS" in the repeater modules flows to the cooler AMBIENT AIR. With the repeaters operating, the temperature of the heat generating parts (HOT PARTS) and all other thermal nodes between the HOT PARTS and the AMBIENT AIR surrounding the repeater housing will increase until thermal equilibrium is reached, i.e. the quantity of heat flowing out of the repeater housing equals the quantity of waste heat generated within. The thermal resistances represent the main heat transfer paths associated with solid and gaseous conduction, natural convection and radiation, and take into consideration the thermal properties of thin materials and poorly mated surfaces. In contrast simple electrical networks with similar schematic appearance, most thermal resistances vary non-linearly with the temperature across and the heat flow through them. Accordingly, a precise analysis of this heat flow system would involve sophisticated techniques such as Finite Element Analysis and/or Computation Fluid Dynamics to solve the array of partial differential equations.

Heat generated in the aggregation of HOT PARTS can flow outward along three main paths. The primary path $\Theta_{H-E}$ relies upon natural convection to circulate air through the holes in the repeater modules and carry the heat to the inner surface of the ENCLOSURE at its highest point. Another convective path $\Theta_{H-C}$ transfers a portion of the waste heat to the CHASSIS (the Series 7000 basket and '819 stubs) The last major path $\Theta_{H-C}$ uses a combination, which depends upon the specific packaging of the repeater, of solid and gaseous conduction, natural convection and radiation to transfer waste heat to the MODULE casing.

Heat transferred to the repeater MODULE casing can flow outward along two main paths. A first path $\Theta_{M-E}$ to the inner surface of the ENCLOSURE is almost entirely via natural convection and is very dependent upon the design of the CHASSIS. The small space generally provided between MODULE and CHASSIS can severely restrict natural convection air flow over the sides of the MODULE because of boundary layer effects. The other path $\Theta_{M-C}$ to the CHASSIS uses convection, gaseous conduction and radiation, and is also very dependent upon the CHASSIS design. The contribution of solid conduction is minimal because the mating surfaces are not sufficiently conforming and under enough contact pressure to exclude the air interface. Furthermore, the profusion of holes in both the repeater MODULE and in the CHASSIS significantly reduce the surface area available for MODULE to CHASSIS contact.

The path $\Theta_{C\text{-}E}$ from the CHASSIS to the ENCLOSURE includes natural convection, which concentrates the transferred heat on the inner top surface of the ENCLOSURE, radiation, which transfers a small fraction of the waste heat to the side walls, and solid conduction to the bottom of the ENCLOSURE. The thin metal or plastic CHASSIS and the frequent presence of thermal barriers in the form of mechanical joints generally minimize heat transfer along the solid conduction path.

The final path $\Theta_{E\text{-}A}$ is from the inner surface of the ENCLOSURE to the surrounding AMBIENT AIR where the waste heat is dissipated. That part of the path from the inner surface to the outer surface of the ENCLOSURE is via solid conduction. Because the inner to outer distance is small and the transfer area large, the solid conduction resistance through to the outside of the ENCLOSURE is negligible. However, even if the environmental ENCLOSURE is metallic as in the stainless steel SPC 7000, the thermal resistance representing the diffusion of waste heat across the surface area of the thin metal or most plastic ENCLOSURES is very high and thus the heat transferred to an area on the ENCLOSURE remains localized. From the heated surface of the ENCLOSURE, the waste heat is then transferred via natural convection to the surrounding AMBIENT AIR.

This model shows that known repeater housings 1) primarily use high thermal resistance, natural convection within the housing to transfer waste heat to the environmental enclosure and 2) make inefficient use of the surface area of the enclosure as a thermal interface to the surrounding ambient air. As a result the capacity of the known repeater housings to dissipate heat and thus the number of HDSL and other high or medium power consumption repeaters (such as ISDN and DDS) that can be deployed within known housings is severely constrained. To solve this problem, Applicant applies the principles of thermal collection, transfer, and distribution via solid thermal conduction as illustrated in FIGS. 8a through 8e to reduce the thermal resistance between the HOT PARTS and the AMBIENT AIR with the result being a dramatic increase in the thermal transfer capacity of the repeater housing.

Figure 8A:
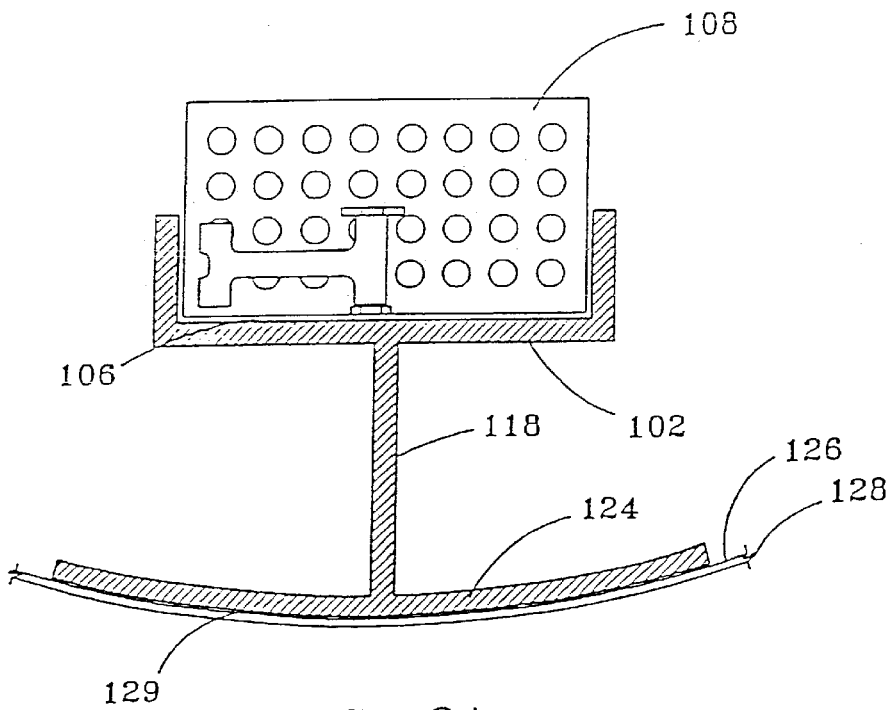
FIGS. 8a through 8e are simplified illustrations of thermal collection, transfer and distribution mechanisms in a thin-walled environmental enclosure in accordance with the present invention.

Thermal collection members 102 shown in FIG. 8a and 104 shown in FIGS. 8b–8e, which are manufactured from a thermally conductive material such as aluminum or thermally conductive plastic, form a thermal interface 106 with repeater module 108 that collects the waste heat generated within the repeater module and reduces the thermal resistance $\Theta_{H\text{-}M}$ from the HOT PARTS to the repeater MODULE. In addition, the collection member may perform, in full or in part, the mechanical functions performed by the chassis in known repeater housings.

Taking into account only the thermal and mechanical functions, thermal collection member 104 is preferred over member 102 because it fully surrounds the repeater module and thus collects waste heat from each of its major surfaces. However, space and weight considerations, lower waste heat transfer requirements or the fact that a particular module generates a vast majority of its waste heat on a single surface may favor collection member 104. In either case, it would be ideal if the collection member's inner surface 110 and the repeater module's outer surface 112 were in intimate mechanical contact over the full surface of the repeater module. This would "short out" thermal resistance $\Theta_{M\text{-}C}$ from the MODULE to the CHASSIS. However, mechanical tolerances and small variations in the actual outer dimensions of repeater modules from different manufacturers make full intimate mechanical contact difficult and not cost effective to achieve. However, the actual benefits from full contact in contrast to small air interfaces are small.

Figure 8B:
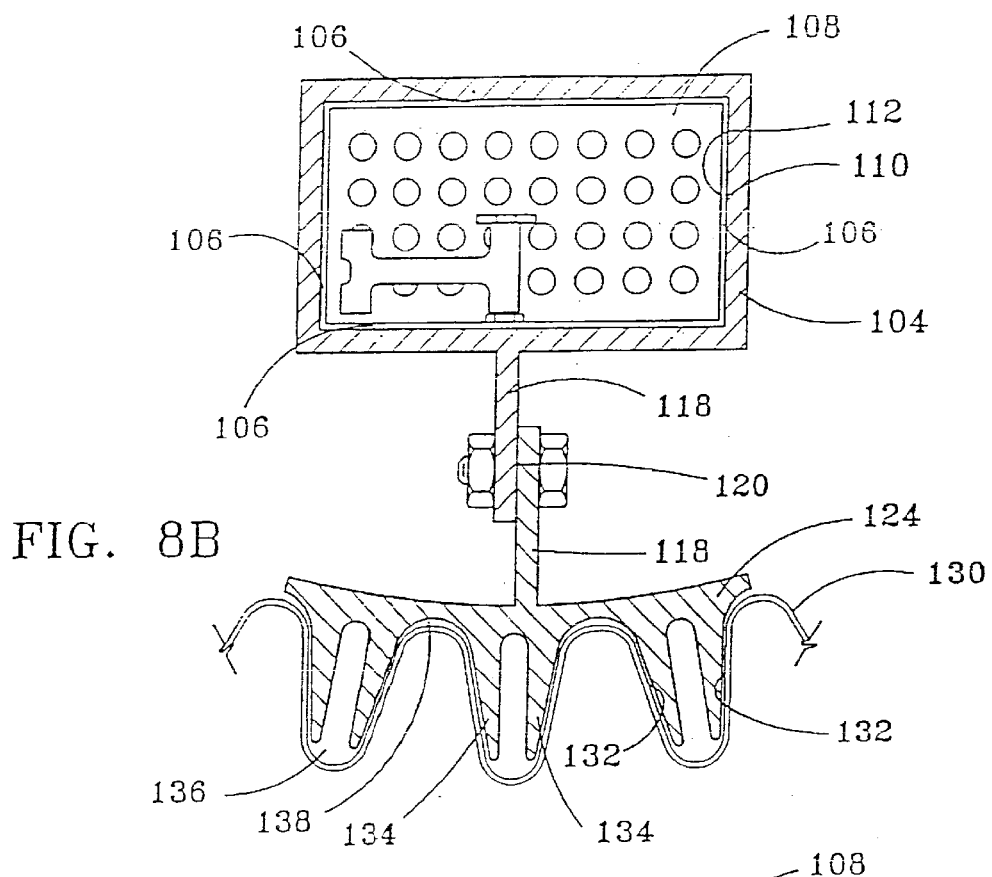
Figure 8C:
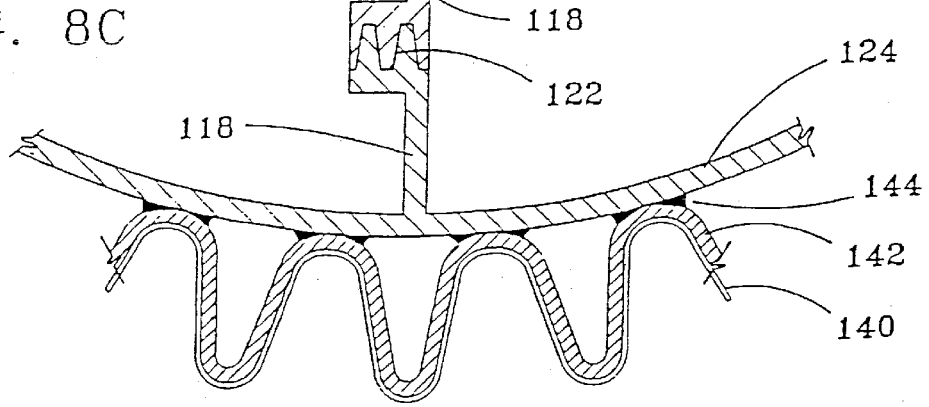

For example, as in FIG. 8c, if a uniform air gap of 0.020 inches (enlarged for clarity) was maintained between the collection member and the repeater module, the thermal resistance $\Theta_{M\text{-}C}$ from the MODULE to the CHASSIS would be approximately 0.68° C. per watt for a 239 double wide module. For an HDSL repeater generating 6 watts of waste heat, if all that heat was transferred across air interface 114, the differential temperature across the interface would only be approximately 4.1° C., an acceptable fraction of the overall thermal transfer budget and a major improvement over the prior art. If an unacceptably large air gap were encountered, a conductive shim 116 as illustrated in FIG. 8c could be used to replace some of the air in the thermal interface.

The collection member also functions to reduce thermal resistance $\Theta_{H\text{-}M}$ from the HOT PARTS to the repeater MODULE casing. Repeater module casings are generally made from thin plastic or metal and thus exhibit a relatively high thermal resistance to heat diffusion over the surface of the casing. As a result, a hot part will tend to produce a hot spot on the adjacent module casing that will elevate the temperature of the hot part even if the average temperature of the module is substantially lower. The thermally conductive collection member acts in parallel with the module casing's relatively high thermal diffusion resistance to bleed off waste heat from potential hot spots.

A thermal transfer member 118, manufactured from a thermally conductive material such as aluminum or thermally conductive plastic, provides a conduction path that is designed to "short out" thermal resistance $\Theta_{C\text{-}E}$ from the CHASSIS to the inside of the ENCLOSURE by changing it from a natural convection and radiation path to one using solid conduction. Analysis and tests demonstrate that use of a transfer member 0.2 inches thick, 2 inches long and 6 inches high produces a thermal resistance $\Theta_{C\text{-}E}$ of approximately 0.42 per watt. For an HDSL repeater generating 6 watts of waste heat, if all that heat was transferred along transfer member 118, the differential temperature would only be about 2.5° C., a major improvement over the thermal resistance that can be achieved with natural convection and radiation. The thermal resistance $\Theta_{C\text{-}E}$ can be further reduced and the temperature difference across the transfer member made to approach zero by moving the repeater closer to the side of the enclosure.

Oftentimes the transfer of waste heat to the enclosure requires transferring waste heat across mechanical joints. The thermal resistance caused by such mechanical joints is reduced by minimizing the thickness of the air film sandwiched in the joint and increasing the thermal interface area. The overlapping and interdigitated joints 120 and 122 shown in FIGS. 8b and 8c, respectively, solve the problem, and are particularly useful in transferring waste heat to the housing's top and bottom surfaces.

Distribution addresses $\Theta_{E\text{-}A}$, the path from the ENCLOSURE to the surrounding AMBIENT AIR. The largest fraction of $\Theta_{E\text{-}A}$ is determined by the exposed surface area of the enclosure that carries significant amounts of waste heat. The larger the surface area the lower the resistance. In known convection based repeater housings, a disproportionate share of the waste heat is distributed to the top surface of the enclosure, which represents only a small fraction of the available surface area. Furthermore, the top surface is typically a horizontal surface, which, is less effective for natural convection than vertical surfaces of equal size. Third, the thin stainless steel or plastic enclosures are extremely poor at diffusing heat over their surfaces and thus tend to localize the waste heat. Lastly, the available external surface area is limited by the smooth shape of the enclosure. Taken together, these limitations provide an insufficient effective surface area for efficiently transferring waste heat to the AMBIENT AIR.

The distribution members shown in FIGS. 8a–8e overcome each of these limitations and realize a substantial reduction in thermal resistance $\Theta_{E-A}$ by increasing the total surface area that carries significant amounts of waste heat. Waste heat is primarily distributed over the sidewalls of the enclosure, which typically have a much larger surface area than the top and are usually oriented in a vertical direction. Secondarily, waste heat can also be distributed to the base and top cover. Most importantly, the distribution member creates a thermal interface that directly distributes the waste heat over the enclosure's surface area rather than relying on the enclosure itself to distribute heat. Lastly, the enclosure's external surface area can be expanded by a factor of 200% to 400% or even more.

As illustrated in FIG. 8a, a distribution member 124, manufactured from a thermally conductive material such as aluminum or thermally conductive plastic, is placed in close, conformal thermal proximity to the inner wall 126 of the environmental enclosure, 128. Although distribution elements of the invention can and will be used to enhance thermal transfer from many different surfaces of various types of repeater housings, in the example of the SPC 7000 series, an aluminum distribution element averaging 0.15 thick, can turn the vertical sides of the environmental enclosure dome into a very effective thermal interface to the surrounding ambient air and substantially reduce thermal resistance $\Theta_{E-A}$. This simple distribution member creates a thermal interface 129 between the distribution member and the enclosure that directly distributes waste heat over an enlarged vertical surface area.

As illustrated in FIGS. 8b–8e, the available external surface area can be greatly expanded with supporting distribution. Merely expanding the external surface area without supporting distribution is of limited value. As shown in FIG. 8b, the environmental enclosure, which is generally smooth sided in known repeater housings, can be corrugated 130 to increase its surface area by a factor of 200% to 400%. Because thin material environmental enclosures are poor heat distributors, distribution member 124 is shaped to contact flanks 132 of corrugations 130. As a further refinement, distribution member 124 is formed with at least one bifurcated distribution fin 134. This bifurcated design saves weight and provides some slight flexibility to conform to and apply pressure to flanks 132 of corrugations 130. For similar reasons, it is recommended that unsupported space be left in the outer diameter 136 and inner diameter 138 of corrugations 130. In addition to accommodating manufacturing tolerances, this flexible fin design can also provide some cushioning to shocks from both handling and vandalism. In a variation of this design, the environmental enclosure might be formed from molded plastic or fiberglass over a solid thermally conducting inner structure (not shown).

As shown in FIG. 8c, an alternate approach uses a corrugated environmental shell 140 which is lined with a thermally conducting material 142 to provide thermal distribution. Thermal lining 142 is joined to the inner distribution element 124 in a thermally conductive joint 144 using dip braising, thermally conductive adhesives, etc. This approach allows very effective distribution to be accomplished at minimum weight.

Figure 8D:
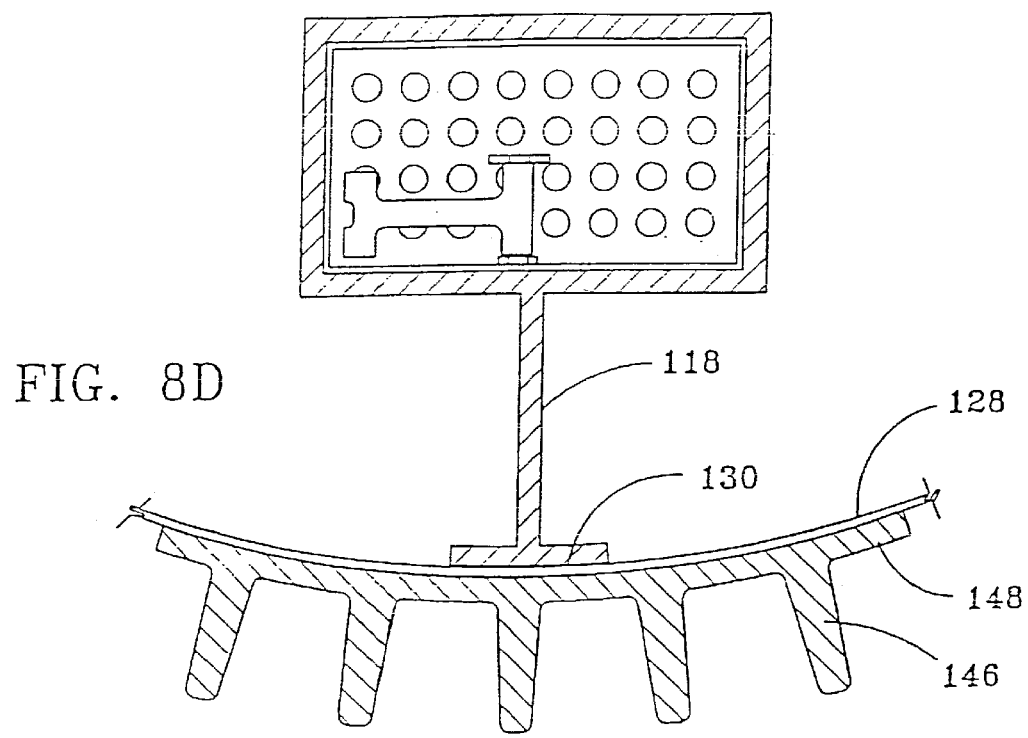

Yet another alternative is illustrated in FIG. 8d, in which fins 146, formed from a suitable thermally conducting material such as aluminum, are placed on the exterior of the environmental enclosure 128. With this alternative, the primary distribution member 148 is placed on the outside of environmental enclosure 128 and a overlapping thermal joint 130 is used to make the thermal connection from transfer member 118 to distribution member 148. So long as care is taken to create a good thermal joint at the transfer to distribution interfaces, there is little thermal detriment to locating some or all of the distribution element on the exterior of the environmental enclosure. Because this alternative places thermally conductive material on the outside of the environmental enclosure, it would only be suitable in non-corrosive environments or if implemented with corrosion resistant material.

Figure 8E:
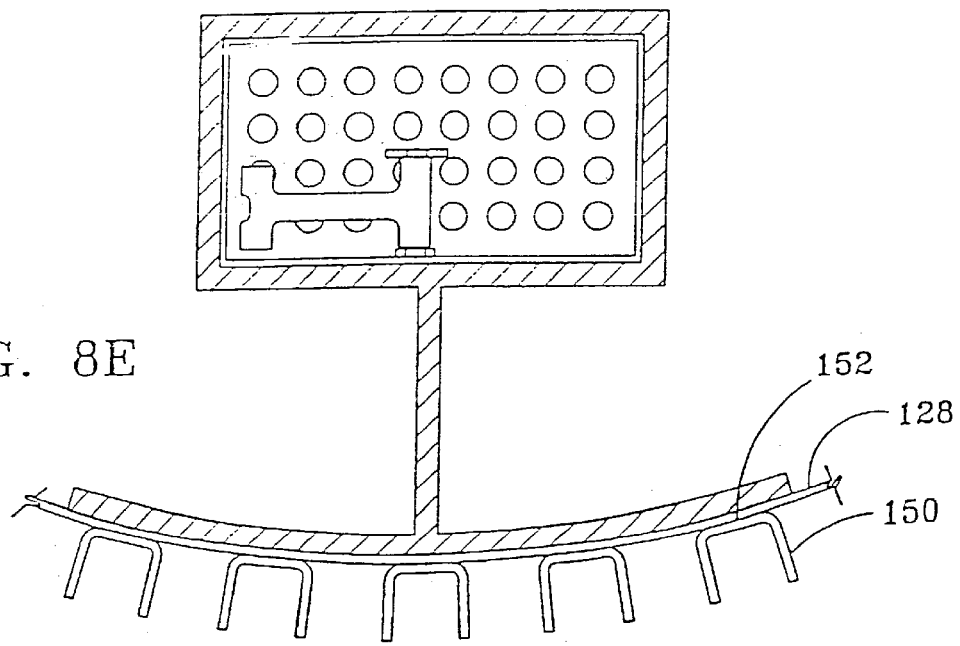

The above expanded external surface alternatives are meant to illustrate methods to maximize distribution. Many repeater housings will not require maximum distribution. For example, FIG. 8e illustrates a relatively simple way to expand the external surface area of the environmental enclosure. Short fins 150 can be fastened to the environmental enclosure 128 by a process such as spot welding. Although the poor thermal conductivity of stainless steel and the thermal resistance of the enclosure-to-fin interface 152 will limit the efficiency of such a design and will limit the useful height of the fins, it is practical to double the effective external surface area of a selected zone on a repeater housing in this manner.

Figure 9:
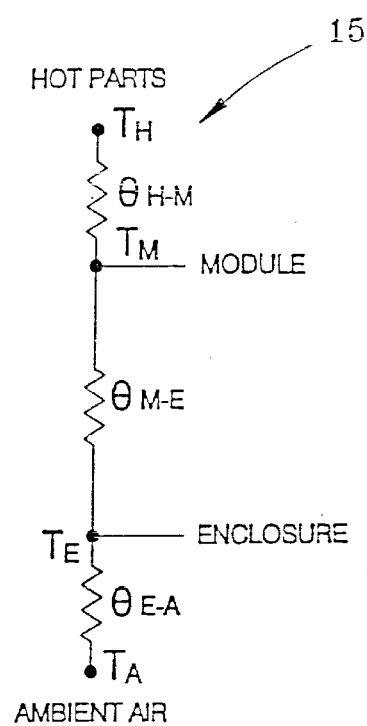
FIG. 9 is a simplified thermal resistance model of a repeater housing incorporating the thermal collection, transfer and distribution mechanisms.

By employing the collection, transfer, and distribution principles via solid thermal conduction, the convection based model shown in FIG. 7 can be further simplified to a conduction based model 154 as shown in FIG. 9. The thermal resistance from the HOT PARTS to the MODULE $\Theta_{H-M}$ is primarily set by the repeater's design, however, as discussed previously, the collection member reduces this resistance somewhat by diffusing module casing hot spots. The thermal resistance $\Theta_{M-E}$, from the MODULE to the inside surface of the environmental ENCLOSURE is so significantly reduced that the parallel convective paths can be eliminated from the model. They still remain and a prudent designer will seek to minimize them, however the effect is at most second order. Tests have shown that $\Theta_{M-E}$ can be reduced to approximately 1° C. per watt for a 239 double wide module, resulting in the transfer of up to 6 watts of heat from an HDSL repeater with a temperature differential of only 6° C. The thermal resistance $\Theta_{E-A}$ from the ENCLOSURE to AMBIENT AIR has also been significantly reduced by combining the distribution techniques with an expanded external surface area. The bottom line is that repeater housings that could accommodate 2 or maybe 3 239 double wide modules can now accept 8–12 modules. Furthermore, these principles can be used to design repeater housings that satisfy both the environmental and thermal demands.

Figure 10:
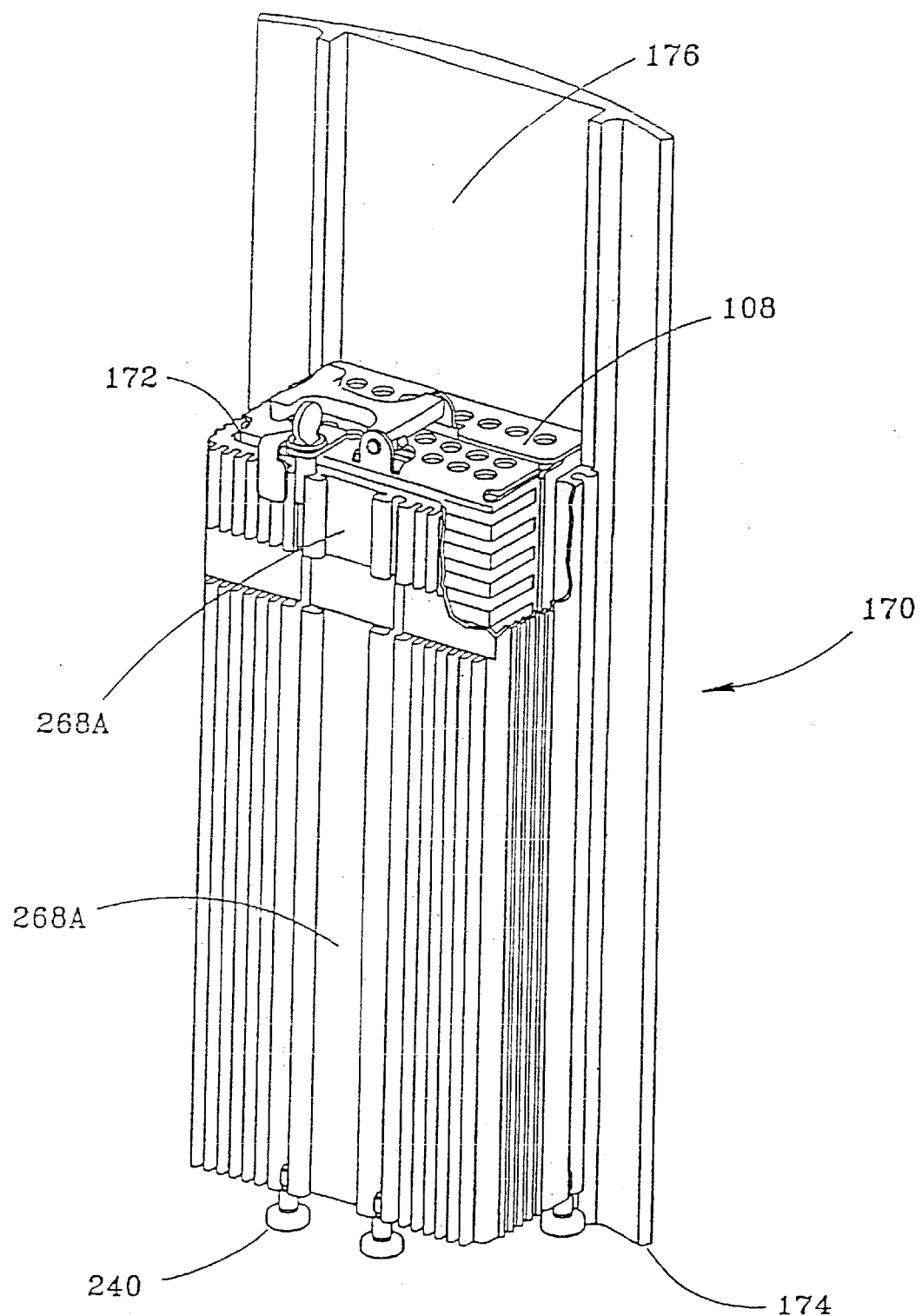
FIG. 10 illustrates a preferred thermal sleeve for performing the thermal collection, transfer and distribution.

To illustrate the collection, transfer and distribution functions and how they simplify and greatly reduce the thermal resistance, each function was depicted in FIGS. 8a–8e as a separate physical element. While appropriate in some applications, the separation of elements is not always necessary of even desirable. As shown in FIG. 10, the three functions can be integrated into a thermal sleeve 170 formed from a single piece of aluminum extrusion. This specific sleeve was designed for use in the repeater housing detailed in FIGS. 12–16, and thus includes shoulder screws 240 and an inner T-slot 268a for mounting the thermal sleeve.

Thermal sleeve 170 has an inner dimension 172 that forms a thermal interface around repeater module 108 for collecting waste heat. The sleeve is moved from the center of the repeater housing to the side wall of the environmental enclosure to shorten the thermal transfer path to the thickness of the sleeve's front surface 174. That same front surface defines a distribution member 176 that is formed in intimate complementary thermal contact with the enclosure side wall's interior surface. In this case, the distribution member has an arcuate shape that matches that of a cylindrical environmental enclosure. The thermal sleeve is a very efficient, low thermal resistance design that effectively "shorts out" thermal resistance $\Theta_{M-E}$ from the MODULE to the ENCLOSURE and substantially reduces thermal resistance $\Theta_{E-A}$ from the ENCLOSURE to the AMBIENT AIR. Furthermore, the thermal sleeve is relatively light weight, compact and provides the mechanical support functions for the repeater module.

As will be described in great detail in FIGS. 12–16, the SPC 7000 Series enclosure can be modified to incorporate the collection, transfer and distribution elements of the invention using a plurality of the thermal sleeves shown in FIG. 10. The modified enclosure still requires the lineman to remove the entire dome to access the repeater modules and then tip the thermal core to access the voltage surge protectors. In addition to the awkwardness of this process, it requires that the dome and the distribution members be separable, which is sub-optimal from a thermal transfer perspective.

As will be illustrated in detail in FIGS. 19–24, the preferred approach is to manufacture the repeater housing so that the environmental enclosure and thermal transfer chassis are non-separable by, for example, compression fitting or molding the two parts together. To provide access to the repeater modules, a seam is provided at the top of the enclosure so that a cover can be removed, without disturbing the thermal transfer path from the thermal chassis to the enclosure's sidewalls, to provide top/front access to the repeater modules. In addition, the voltage surge protector assemblies are redesigned as shown in FIGS. 11a–11d so that the voltage surge protectors can be accessed through the top, either independently of the repeater module or after first removing the module.

A preferred embodiment of protector assembly 180 is illustrated in FIG. 11a, in which the female pin portion 182 of a protector connector is installed on a printed circuit, board 184 adjacent to a repeater connector 186. Although shown separately, these two connectors may be merged into a single custom connector. The individual protector elements 188 are mounted on a specially designed printed circuit board 190 with the male pin portion 192 of the protector connector. Alternately, the connector's male pins can be attached directly to the protector elements thereby eliminating PCB 190. The resulting protector assembly 190 is preferably made as tall or taller than the adjacent repeater 108 with a slot 194 to facilitate easy access without having to remove the repeater module or risk contacting the high voltage present on the repeater and protector connectors.

Because of the large and rapidly rising currents produced by lighting or utility power cross induced voltage surges, the method used to connect elements 188 to the repeater housing wiring is critical. First, the telecom wires should be routed to the female protector connector 182, not to repeater connector 186. Second, the protector connector must be designed with sufficient spacing between individual contacts to resist high voltage breakdown and utilize contact elements capable of carrying the high currents expected. Third, the interconnection between the male protector connector 192 and the individual protector elements 188 must be capable of carrying these high currents and have a low inductance that passes the rapidly rising current waveform with minimum impedance. A multi-layer printed circuit board with heavy and wide copper traces, designed with very high speed circuit layout practices, can meet these requirements.

Another advantage of this type of protector assembly is that it can easily accommodate test jacks 196 and/or indicator lights 198, as illustrated in FIG. 11b, that are able to take advantage of electrical access to the repeater wiring and combine it with direct top/front access. If desired, the individual protector elements can either be permanently connected to PCB 190 or can be installed in sockets to allow individual service. As illustrated in FIG. 11c, the assembly can also accommodate non-cylindrical protector elements 200 such as solid state voltage surge protectors.

An alternative protector assembly 202 is illustrated in FIG. 11d, in which protector access without repeater removal is sacrificed for a smaller footprint. The female repeater connector 204 is elevated so that the female protector connector 206 is installed under the repeater module. The protector elements are mounted on a PCB with an edge connector 208 that is inserted into connector 206. PCB edge connector 208 is used for illustration only in that a connector style with higher current ratings might be required for this application. This alternate embodiment still provides direct access to the protectors from the top or front of the repeater housing, sate access without the use of special tools and the ability to accommodate a wide range of protector elements.

The repeater housing 210 illustrated in FIGS. 12–16 is a modified SPC Series 7000 repeater housing that incorporates the collection, transfer and distribution techniques described in FIGS. 8–10 above with the existing thin-walled stainless steel environmental enclosure. By using the existing Series 7000 to provide the environmental enclosure wiring, connectors, telecom accessories, pressurization and vent fittings, sealed mechanical joints, deep drawn, stainless steel thin wall environmental enclosures, etc necessary to a repeater housing, Applicant avoided the need to develop, test and gain telecommunications industry approval for these elements, which are necessary in a repeater housing, but incidental to the thermal problem.

Figure 15A:
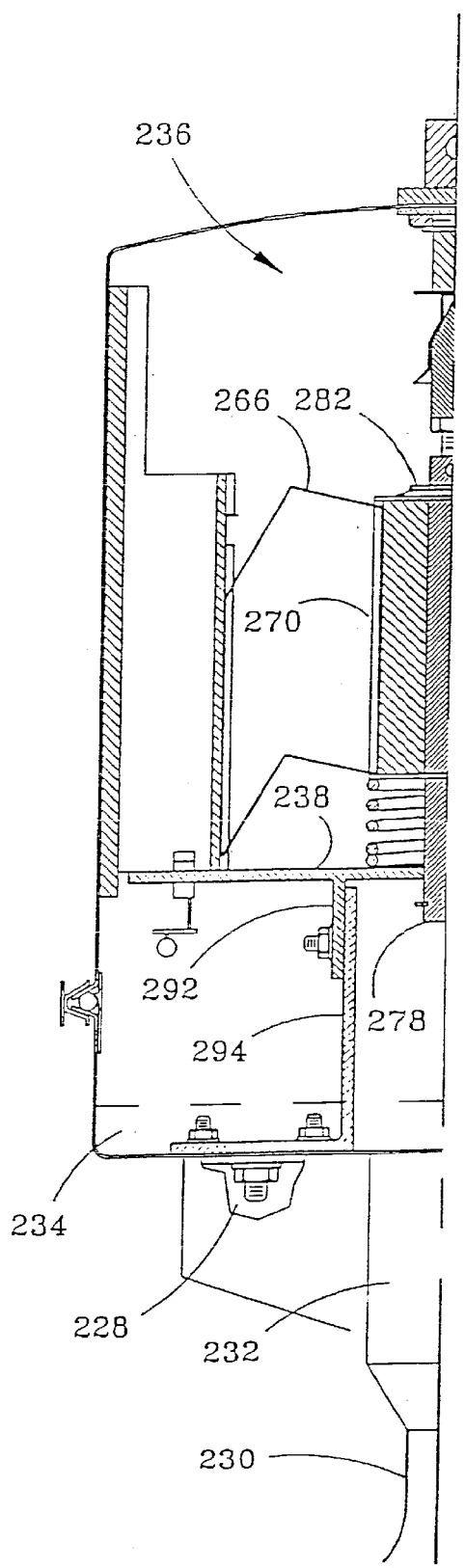
FIGS. 15a and 15b are views along section line 15—15 in FIG. 14 of the repeater housing in its expanded and retracted positions, respectively.
Figure 15B:
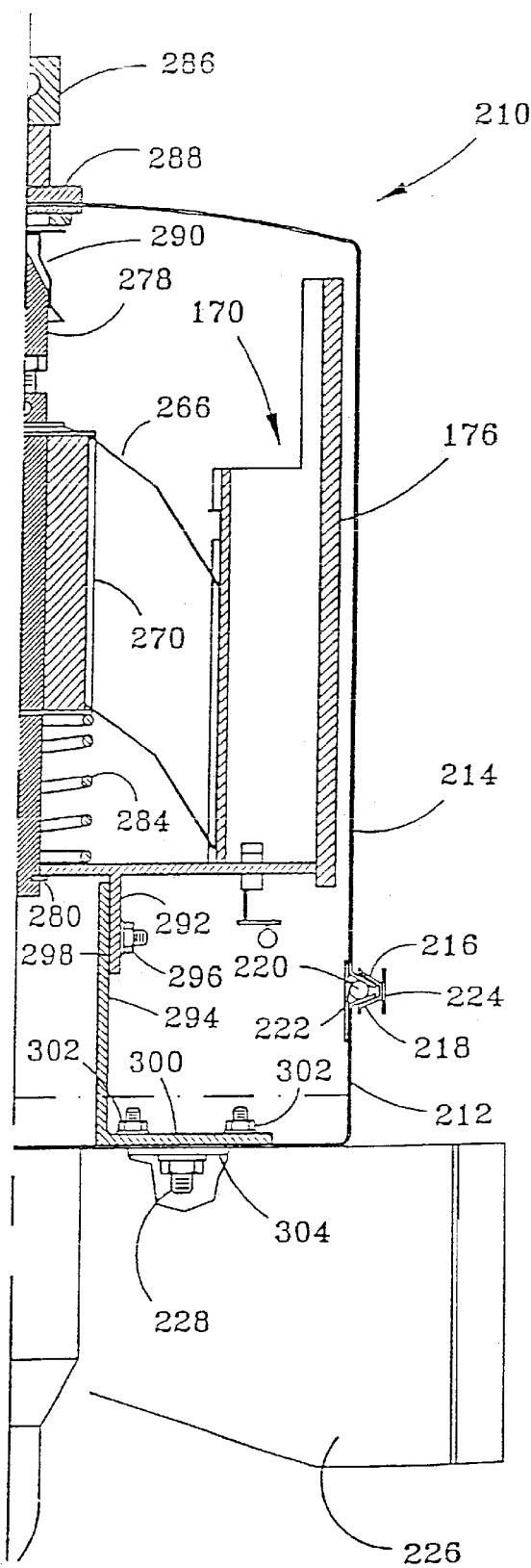

As shown in FIGS. 15a–b, the environmental enclosure of housing 210 includes a base 212 and a dome 214 that are fabricated as seamless thin, approximately 0.035 inch thick, deep drawn stainless steel cylinders having flanges 216 and 218 formed at their respective open ends. An O-ring 220 is positioned on flange 218 and secured in position by O-ring support 222. When dome 214 is installed, the inside wall of the dome fits snugly over O-ring support 222 with its flange 216 resting on O-ring 220. A V-groove clamp 224 is drawn tight over the O-ring assembly to mechanically fasten base 212 and dome 214 together and seal their joint.

A stainless steel mounting bracket 226 is fastened to the bottom of base 212 using threaded studs 228 (only 2 of which are shown) which are welded to base 212. A cable stub 230 is inserted through into base 212 using a fitting 232 designed to provide both strain relief for the cable stub and sealing of this entry. Not shown are additional fittings, such as pressurization, venting and telecommunications accessories that pierce the bottom surface of base 212. These additional fittings are each designed with features to seal their entry points into the base 212. For additional sealing integrity, the bottom of the base and the various fittings that pierce the base are covered with a semi-rigid encapsulant 234.

A plurality of thermal sleeves 170 are positioned inside dome 214 to form a cylindrical thermal core that is in complementary thermal contact with the inner surface of dome 214. Because HDSL repeaters have a high thermal density that is distributed throughout the module, the 4-surface collection provided by the sleeve is desirable. Furthermore, by moving the sleeve to the periphery of the thermal core, the transfer member can be reduced to the thickness of the sleeve, virtually shorting out the thermal resistance to the enclosure. Based upon the amount of waste heat generated by the HDSL repeaters, the maximum specified ambient temperature, the amount of waste heat that can be transferred to the ambient air through the top of the dome and the base and assuming a below ground environment, each sleeves distribution member 176 was required to be approximately 10 inches high and occupy approximately 45 degrees of the circumference of the dome to provide a large enough thermal interface to accommodate 8 HDSL repeater modules.

In order to service the repeater housing, a lineman must be able to remove dome 214. However, to maximize thermal transfer to the ambient air the sleeve's distribution members should be held in close if not intimate thermal contact with the dome. To this end, an actuator mechanism 236 urges the sleeves against the dome's sidewalls when it is sealed to the base and retracts the sleeves to allow the dome to be removed. From the thermal transfer standpoint, alternatives considered included 1) spacing the sleeves away from the dome at a distance sufficient to accommodate manufacturing tolerances and allow easy installation and removal of the dome or 2) spring loading the sleeves against the inside of the dome surface with a force light enough to allow the cover dome to be conveniently installed and removed. One of the environmental conditions for which repeater-housings must be designed is what the telecommunications industry refers to as a Zone 4 earthquake. Mere spring loading probably would not provide enough support to protect the electronics inside the dome.

Figure 12:
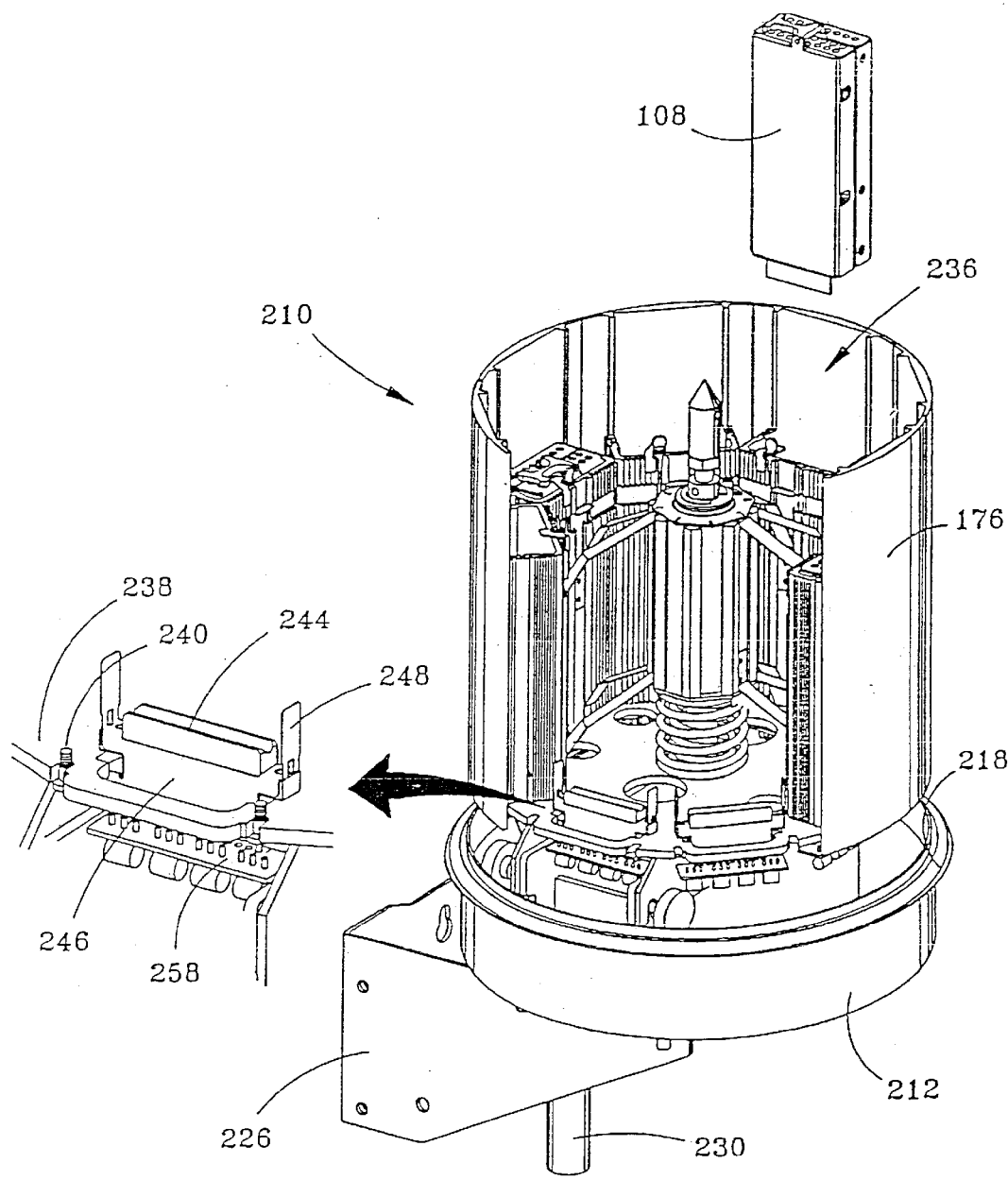
FIG. 12 is a perspective and partially enlarged view of a repeater housing that uses the thermal sleeve within a modified SPC 7000 series thin-walled environmental enclosure.
Figures 13, 14:
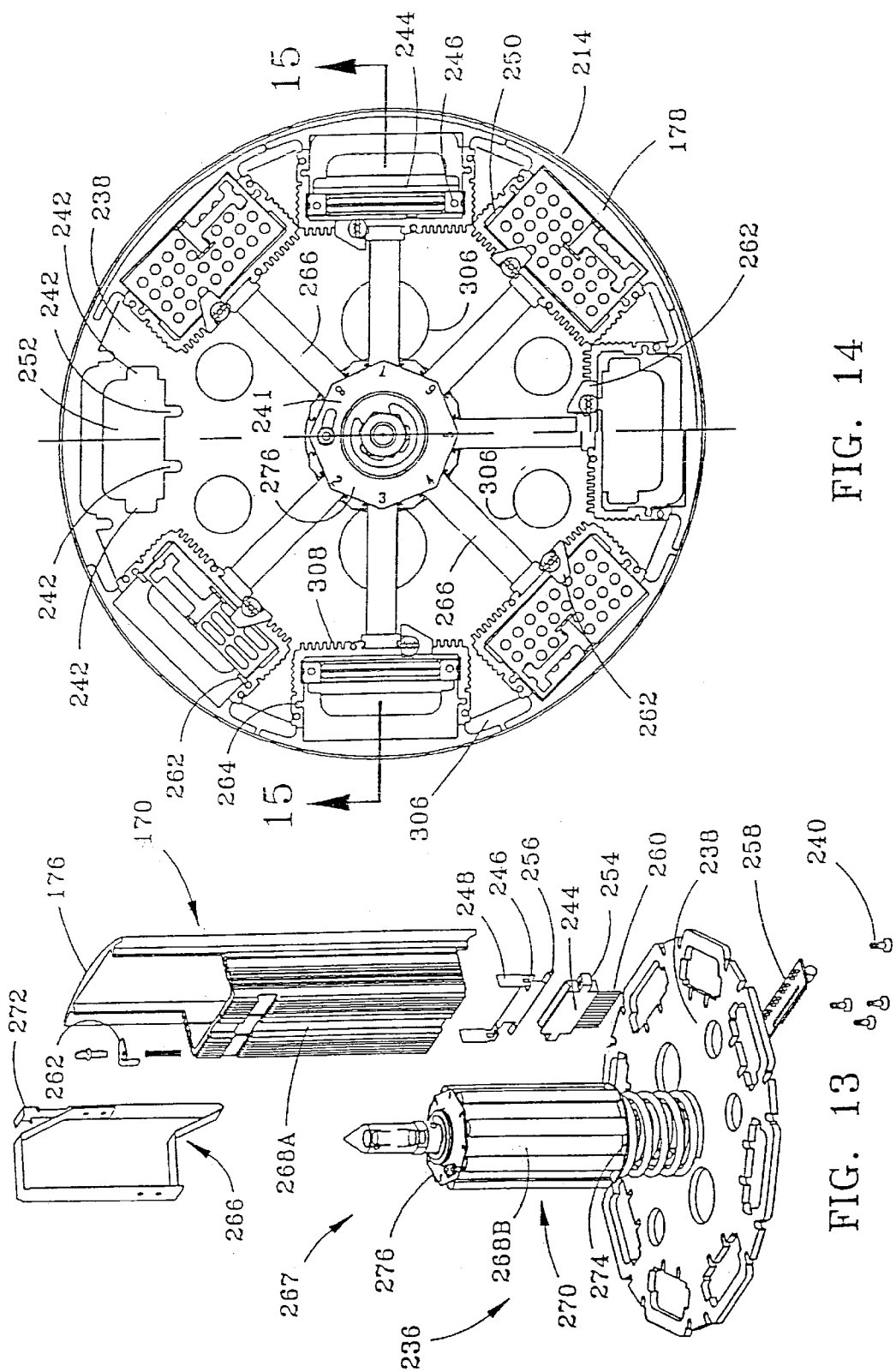
FIG. 13 is an exploded view of the thermal sleeve and the actuator mechanism for urging the sleeve against the interior wall of the environmental enclosure of the repeater housing shown in FIG. 12.
FIG. 14 is a plan view of the repeater housing shown in FIG. 12 in its expanded and retracted positions.

In order for actuator mechanism 236 to move sleeves 170 radially, each sleeve is secured to a platform 238 with four shoulder screws 240 positioned in slots 242 so as to guide but restrain sleeves 170. Since repeater modules 108 must move with the sleeves, repeater connectors 244 must be free to move in concert with the sleeves. Therefore, as illustrated in FIGS. 12 and 13, a connector clip 246 is secured to repeater connector 244. The clip's ears 248 spring outward about 10 degrees and fit into alcoves 250 formed into the sleeves thereby aligning each repeater connector with its host sleeve and forcing each repeater connector to move radially in concert with its host sleeve. To restrain repeater connectors 244 in the vertical direction, they are positioned in cut-outs 252 in platform 238 while mounting connector ears 254 on the connector rest on the platform and stops. 256 on the connector clip slide under the platform. A standard SPC voltage surge protector assembly 258 is plugged on to the connector's wire wrap pins 260 and can, therefore, move with the sleeve. Repeater retainer 262 is used to secure a repeater module once plugged into a sleeve assembly.

Platform 238 and an assortment of sleeve positions are illustrated in FIG. 14 Starting at 12 o'clock and working in a counterclockwise direction as indicated on mast cap 241, position number 1 shows the shoulder screw slots 242 and repeater connector cut-out 252 in platform 238. Position 2 shows an installed 239 mini-repeater, which is held in position with guides 262 mounted in guide slots 264 formed in the sleeve's extruded wall. Positions 3 and 7 show sleeves and their repeater connectors. Positions 4, 6 and 8 are shown with 239 Double Wide repeater modules installed. Position 5 shows a sleeve with neither repeater connector nor repeater installed. The sleeves in positions 2,3 and 4 are shown expanded against dome 214. The sleeves in positions 6, 7 and 8 are shown in the fully retracted position, a travel distance of approximately 0.1 inches.

To move the sleeves radially and exert the pressure necessary to hold them against the inside surface of the cover dome in the presence of worst case earthquake forces, actuator mechanism 236 includes a modified parallelogram spring 266 that translates the vertical motion of a mast assembly 267 into radial force for retraction and expansion of the sleeves. Each parallelogram spring 266 slides into complementary T-slots 268a and 268b (shown best on FIG. 10) formed in each sleeve and on the eight faces of mast hub 270. Once installed, the parallelogram spring is retained in position on the glove by a Hamm latch 272 and on the mast hub by a bottom mast cap 274 and a top mast cap 276.

As shown best on FIG. 15, a mast shaft 278 passes through mast hub 270 and through a hole in platform 238. The upward travel of the mast shaft is limited by an E-clip 280. The upward travel of the mast hub with respect to the mast shaft is limited by an assembly of thrust bearings 282 and another E-clip, thus allowing the mast shaft to rotate within the mast hub. Mast hub 270 is urged upward by a spring 284, which has sufficient strength to retract all eight gloves against the worst case combination of tolerances, wear and friction expected over the repeater housing's operating life.

In order to expand the sleeves, top drive screw 286 is screwed down into its mating top drive seat 288. As the top drive screw moves downward, the attached alignment cone 290 engages the top of mast shaft 278 (the length of which can be adjusted in manufacturing to offset tolerance buildup). As the top drive screw continues downward, thrust bearings 282 allow mast shaft 278, which is now in frictional contact through the alignment cone 290 with top drive screw 286, to freely rotate within mast hub 270. The downward motion of the top drive screw now forces the mast shaft and mast hub downward until the top drive screw reaches the end of its travel against the top drive seat. The top drive assembly contains o-ring seals and sealing surfaces sufficient to prevent leakage into or from the environmental enclosure once the top drive screw is seated against the top drive seat.

As top drive screw 286 forces mast shaft 278 and mast hub 270 downward, toward platform 238, the portion of each parallelogram spring 266 fastened to the mast hub must also move toward the platform. Since the other side of the parallelogram spring is fastened to sleeve 170 and the sleeve is fastened to the platform, the only degree of freedom allowed the parallelogram spring is to force the sleeve radially outward, away from the mast. As illustrated in FIG. 15a and 15b, which respectively show the actuator mechanism in its expanded and retracted positions, the arms of the parallelogram spring not fastened to the mast hub or sleeve are designed to flex in order to accommodate the range of motion needed from the mast hub to provide for adequate expansion and retraction forces over the full range manufacturing tolerances.

Figure 16:
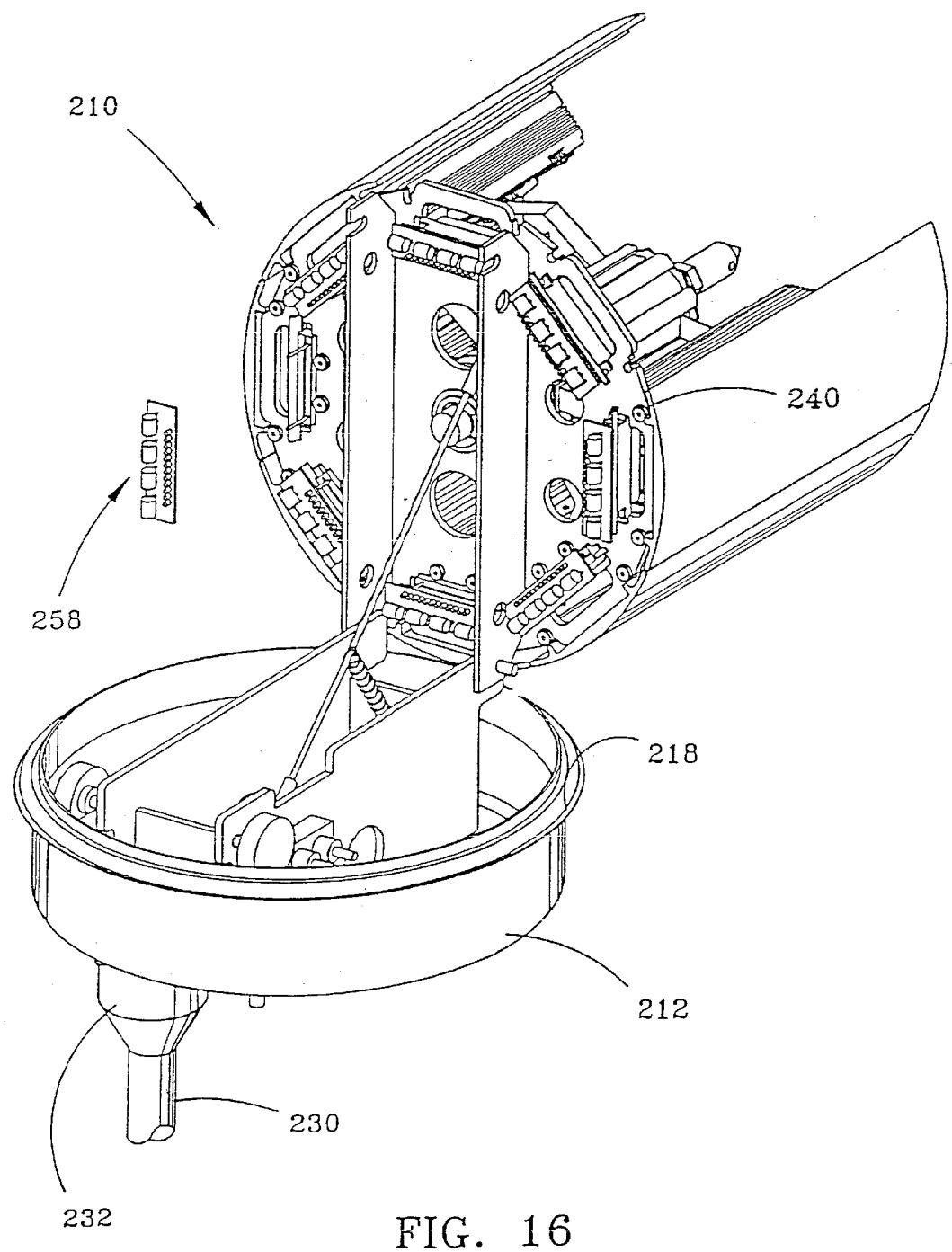
FIG. 16 is a tipped view of the repeater housing shown in FIG. 12.

In addition to the thermal transfer through the sleeve's distribution member to the sidewalls, FIGS. 15a and 15b also illustrate another important waste heat transfer and distribution path. Sleeves 170 rest upon platform 238 and, therefore, although this is a poor quality thermal joint, can transfer some heat to the platform, which is manufactured from aluminum thicker than required for its structural purpose. Thick aluminum bars called downrights 292 are welded to the platform to form a good thermal joint, which are, in turn, attached to an aluminum frame called uprights 294 at two pivot points 296 using overlapping thermal joints 298. The pivot points allow the thermally enhanced chassis, which is everything attached to the platform, to tilt as illustrated in FIG. 16 for access to the underside of the platform and, in particular, to the voltage surge protector modules 258.

The upright bracket is bent to form a large foot 300 that is secured to base 212 with welded studs 302. Although the base is thin stainless steel of poor thermal conductivity, this design creates an overlapping thermal joint by placing the feet of the upright brackets in close proximity with flanges 304 by which the repeater housing mounting bracket 226 is secured to the repeater housing base. This is not a primary thermal transfer and distribution path, however, the effort and cost required to create it are relatively small and the heat removed via this path can reduce the temperature of the rest of the repeater housing and the installed repeaters several degrees centigrade.

Similarly, although natural convection within the repeater housing is no longer the primary heat transfer method, it is prudent to continue to utilize all available thermal transfer paths. Therefore, as shown most clearly in FIG. 14, numerous air holes 306 are placed in the platform to facilitate the circulation of air from the base to the top of the cover dome and small corrugations 308 are formed on the outer surfaces of the sleeves to slightly increase the surface area and substantially increase the radiation emissivity.

In addition to the waste heat generated within the repeater housings, solar loading, i.e., the heat absorbed from solar energy incident upon above ground repeater housings, can be a serious problem. The SPC 7000 Series enclosure may intercept up to 150 watts of incident energy. With an appropriate white coating and allowing for aging and normal surface contamination, it is practical to attain 70% reflectance from a smooth surface repeater housing. However, up to 45 watts of solar energy may be absorbed, which is equivalent to over 7 HDSL repeaters.

One solution is to expand the surface area of the repeater housing a sufficient amount to transfer the additional solar energy to the surrounding ambient air. If the expanded area is achieved with fins or convolutions of the surface, the area can be increased substantially with a minimal increase in the projected area of the housing that captures the solar energy. Unfortunately, this prospective solution is also limited in that such fins or convolutions also significantly reduce the surface reflectivity. This occurs because such fins and convolutions cause multiple reflections and, thereby, become light traps. Fins or convolutions sized to double the effective surface area of a repeater housing would also reduce the reflectivity of a 70% reflective surface to 40% or less on the expanded surface area. This problem is overcome by placing a reflective solar shield around the expanded surface area.

Figure 17:
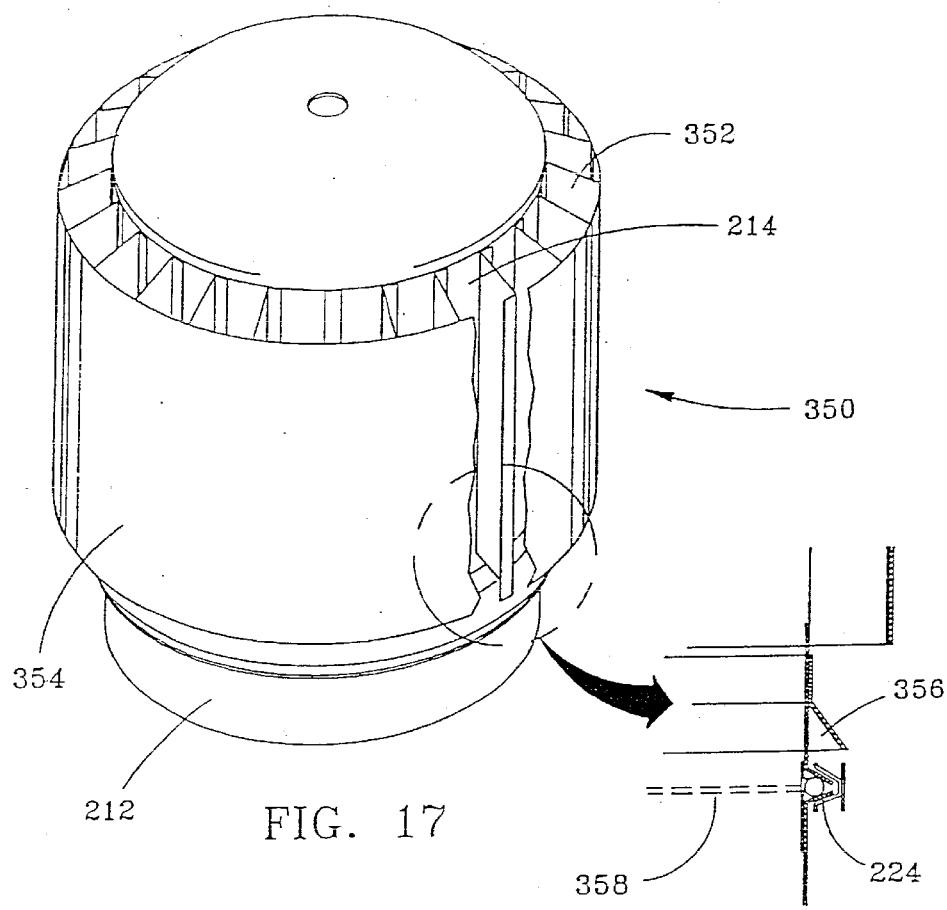
FIG. 17 is a perspective and partially enlarged view of a solar shield for the repeater housing shown in FIG. 12.

The solar-shield assembly 350 illustrated in FIG. 17 includes stainless steel fins 352 that are spot welded to the sidewalls of dome 214 and a thin stainless steel cylinder 354 is spot welded to fins 352 to form an annular ring spaced about 1.25 inches from dome 214, with the entire assembly then painted with an appropriate white coating. A debris skirt 356 is fastened to the environmental enclosure above seam 358 with base 212 to prevent debris from being caught on the edge of V-groove clamp 224.

Solar shield assembly 350 functions as follows: when the sun angle is high overhead, little solar energy is incident upon the vertical sides of the repeater housing. The smooth white cover reflects a large fraction of the incident solar energy and the inner portions of the fins closest to the environmental enclosure increase the external surface area sufficiently to dissipate the extra solar energy to the surrounding ambient air. Although thin stainless steel fins are poor thermal conductors, as previously explained and illustrated as FIG. 8e, short fins can be useful.

As the sun angle shifts from the vertical towards the horizontal, the solar shield 354 intercepts most of the solar energy that would otherwise heat the vertical side of the environmental enclosure dome 214. This, of course, heats the solar shield. However, the shield has both its inner and outer surfaces available to transfer the solar energy into the surrounding ambient air via natural convection. Furthermore, the outer portions of fins 352 also serve as an expanded external surface to aid in the natural convection transfer. This combination of surfaces is more than enough to dissipate to the ambient air the solar energy absorbed by solar shield 354 and that portion of the fins 352 exposed to the solar radiation.

Figures 18A, 18B, 18C:
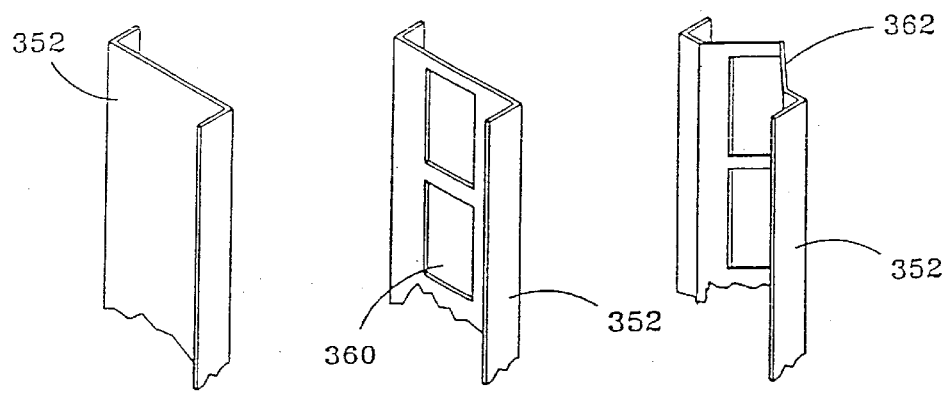
FIGS. 18a, 18b and 18c are respectively detailed implementations of the fins shown in FIG. 17.

In some applications, it is desirable for the environmental enclosure to operate at a temperature lower than that of the solar shield. In such cases, it is important to minimize the heat conducted from the solar shield 354 through fins 352 to environmental enclosure 214. FIG. 18a illustrates a portion of fin 352 having an inside tab that is fastened to the environmental enclosure and an outside tab that is fastened to the solar shield. If manufactured from a material of only moderate thermal conductivity such as stainless steel, the inner and outer portions of the fin near the environmental enclosure and the solar shield, respectively, will serve as an extra surface from which to dissipate heat into the natural convective air flow. However, if designed correctly, the fin will not be effective at conducting significant amounts of heat the full width of the fin from a hotter solar shield to a cooler enclosure as heat is removed from the surfaces of the fin via natural convection.

FIGS. 18b and 18c illustrate ways to use parts of fin 352 as natural convection surfaces while increasing thermal isolation between the environmental enclosure and solar shield 354. In FIG. 18b, slots 360 have been cut in the fin to reduce the cross sectional area available for thermal conduction while leaving enough material to maintain mechanical integrity. In FIG. 18c, in addition to the slots, the conductive distance has been increased by adding a series of bends 362 to the portion of the fin providing the mechanical connection.

Although, the modified SPC 7000 Series repeater housing illustrated in FIGS. 12–16 incorporating the solid thermal conduction collection, transfer and distribution principles represents a substantial improvement in thermal transfer capability over the known SPC 7000 Series, it still suffers from the access difficulties associated with "tilt, swivel and around the back" and requires a moderately complex mechanism to expand and retract the thermal sleeves, accommodate an accumulation of manufacturing tolerances, wear and tear, survive a zone 4 earthquake and protect its housed repeaters from a shotgun blast at close range. These limitations are overcome by incorporating the thermal transfer techniques described in FIGS. 8a–8e, 9 and 10 with the voltage protector assemblies described in FIGS. 11a–11d that facilitate direct top or front access.

Figure 19:
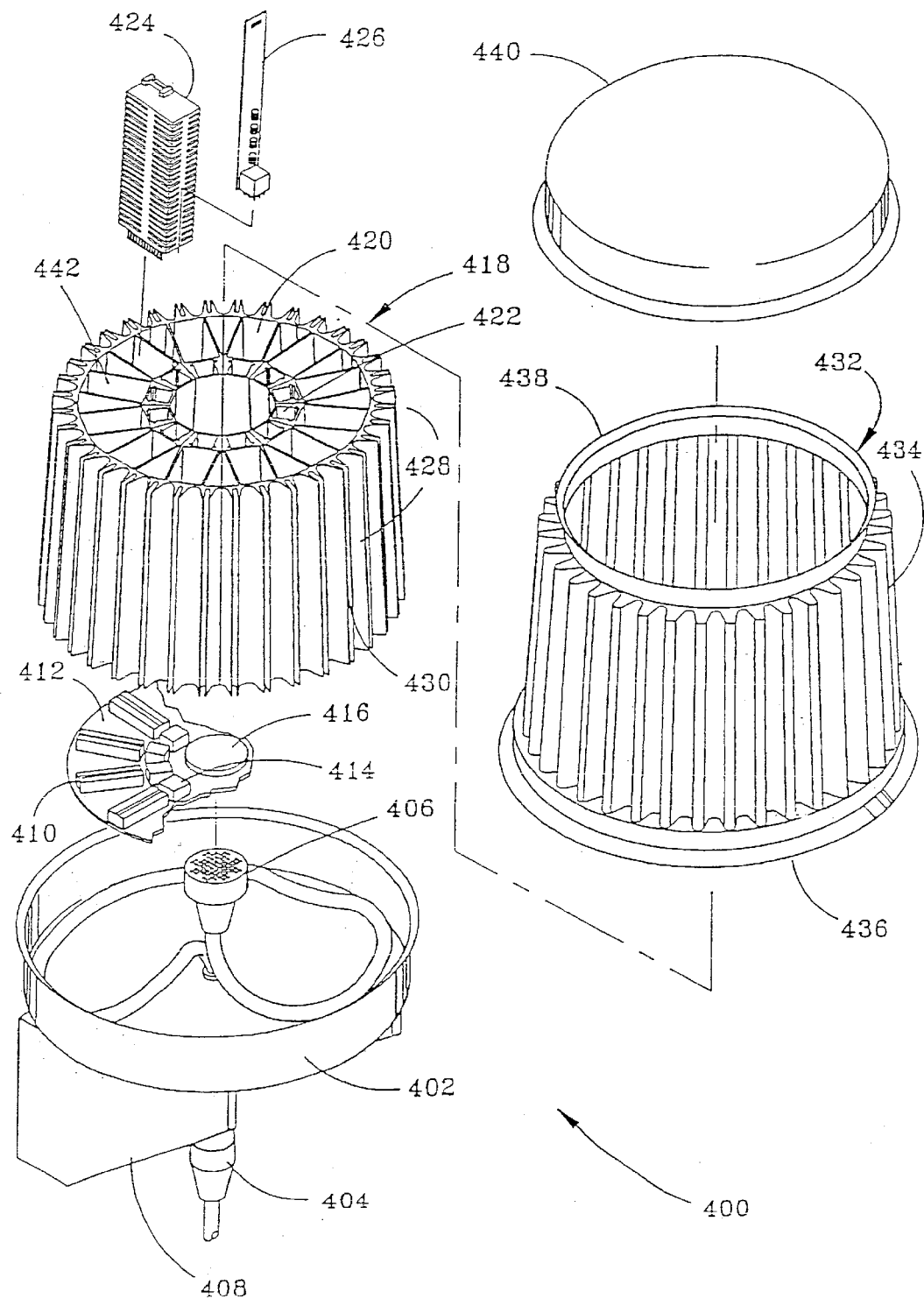
FIG. 19 is an exploded view of a preferred above-ground, cylindrical repeater housing.
Figure 20:
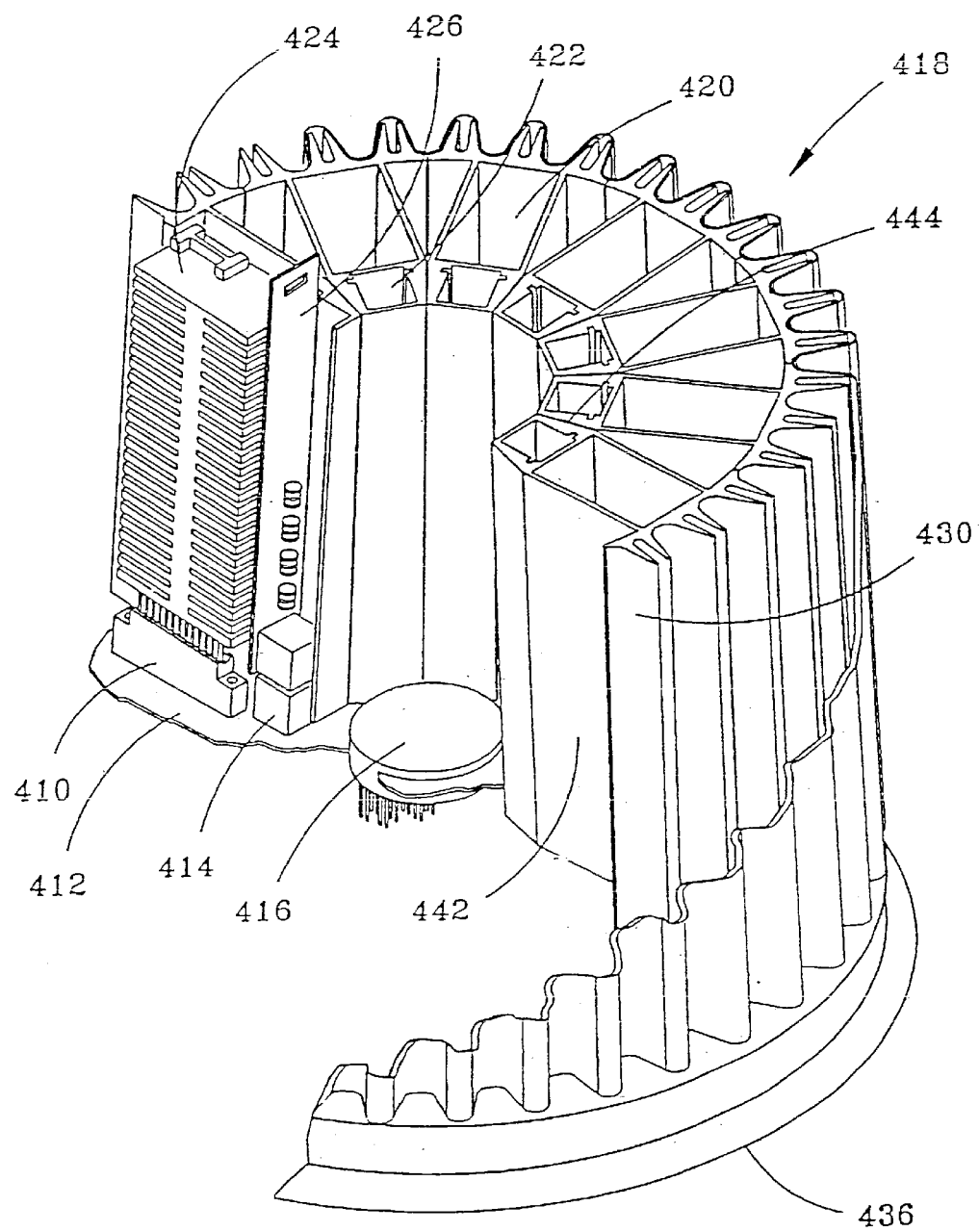
FIG. 20 is a partially cut-away view of the assembled cylindrical repeater housing shown in FIG. 19.

Although applicable to any housing shape or configuration, the technique is illustrated in the context of two different cylindrical repeater housings. The first, illustrated in FIGS. 19 and 20, is designed for use above-ground in a vertical orientation. The second, illustrated in FIGS. 21–24, is designed for use below-ground in a horizontal orientation. The intended orientation is important because it dictates the orientation of the external fins to optimize natural convective air flow.

As shown in FIGS. 19 and 20, an above-ground cylindrical repeater housing 400 comprises a cylindrical base 402 that receives a cable stub 404 that is preferably terminated with a master connector 406. A mounting bracket 408 is used to mount the base 402 in an upright position on a telephone pole, for example. A plurality of repeater connectors 410 are disposed radially around a PCB 412 with their protector connectors 414 positioned towards the center of the PCB. A mating master connector 416 is positioned at the center of the PCB for connection to master connector 406. Alternately, any of the protector assemblies illustrated in FIGS. 11a–11d could be used and the connectors could be wired using conventional wire-wrapping techniques instead of the master connector. Furthermore, if on-site access to the wiring is not required, the base can be eliminated and the cable and connections below the PCB encapsulated to provide the necessary mechanical strength and environmental protection at a considerable cost savings.

A thermal chassis 418 is placed over PCB 412 to define a radial slot 420 over each repeater connector 410 and provides the collection, transfer and distribution functions as described in detail previously, and, preferably, to define an inner slot 422 over each protector connector 414. Repeater modules 424 and protectors 426 are inserted in slots 420 and 422, respectively, and mounted in connectors 410 and 414. The outer surface of thermal chassis 418 is preferably formed with an axial extrusion pattern 428 such as the bifurcated fins 430.

A thin-walled shell 432, manufactured, from a material suitable for environmental protection such as stainless steel, plastic or fiberglass, fits in complementary thermal contact around thermal chassis 418. Shell 432 is preferably corrugated to define a plurality of axial fins 434 that fit over the chassis' extrusion pattern 428. Alternately, shell 432 and chassis 420 could utilize any of the other expanded external surface designs illustrated in FIGS. 8a–8e or even a smooth sided, non-expanded design.

Flanges 436 and 438 are formed at both ends of shell 432 for connection to base 402 and an access cover 440, respectively, using V-groove clamps and seals (not shown) The seam at flange 436 provides bottom access to the wiring on the underside of thermal chassis 420. This is useful during manufacturing and on very rare occasions in the field. The seam at flange 438 provides direct top access to thermal chassis 420 for removing repeater modules 424 and voltage surge protectors 426.

Thermal chassis 420 and thin-walled shell 432 can be manufactured in many different ways depending upon the requirements of a specific repeater housing such as thermal transfer capacity, quantity and type of repeaters and cost. One approach is to use a thermally conductive adhesive to glue together a plurality of thermal sleeves 442, similar to the one shown in FIG. 10 but extended to cover the protector connector and rotated ninety degrees to optimize the available space. Extrusion pattern 428 can be either formed into the distribution surface of the sleeve or separately fastened thereto. Alternately, the entire thermal chassis 420 can be cast or molded as a single unit or molded inside the shell 432. In addition, individual thermal sleeves could be fit inside the shell and mechanically secured so that they could be disassembled at a later time.

Shell 432 can be a separate piece, formed, cast or molded with the desired complementary extrusion pattern, that is slid over the thermal chassis to provide a compression fit. The compression fit can be improved by forming the chassis and shell with a complementary taper as shown in FIG. 19 that forces the chassis', extrusion pattern into the shell to provide a good thermal and mechanical joint. Alternately, the shell can be molded over the chassis using a moldable material such as plastic. This approach avoids the need for a tapered design and accommodates the manufacturing tolerances of the chassis in the wall thickness of the shell.

Because repeater housing 400 is intended for use above ground, it should also accommodate solar loading. One approach is to place a solar shield of the type illustrated in FIG. 18 around the housing. In addition, thermal transfer from access cover 440 to the chassis should be minimized. This is accomplished by making the joint between the cover and chassis a poor thermal conductor and possibly insulating the inside of the access cover. In contrast, thermal transfer from the chassis' to the relatively cool base 402 and to mounting bracket 408 should be encouraged. This is accomplished using a combination of overlapping and interdigitated thermal joints not illustrated for this embodiment, but using the techniques described for the front access cover in the horizontal cylinder ahead. In addition, thermal sleeves 442 and particularly the portion that defines the inner slot for the protectors are designed to form overlapping thermal joints 444 that form a cross-conduction path around the interior of the chassis. As a result, heat from a sunny side of the housing can be transferred to the shady side through the cross-conduction path.

Figure 21:
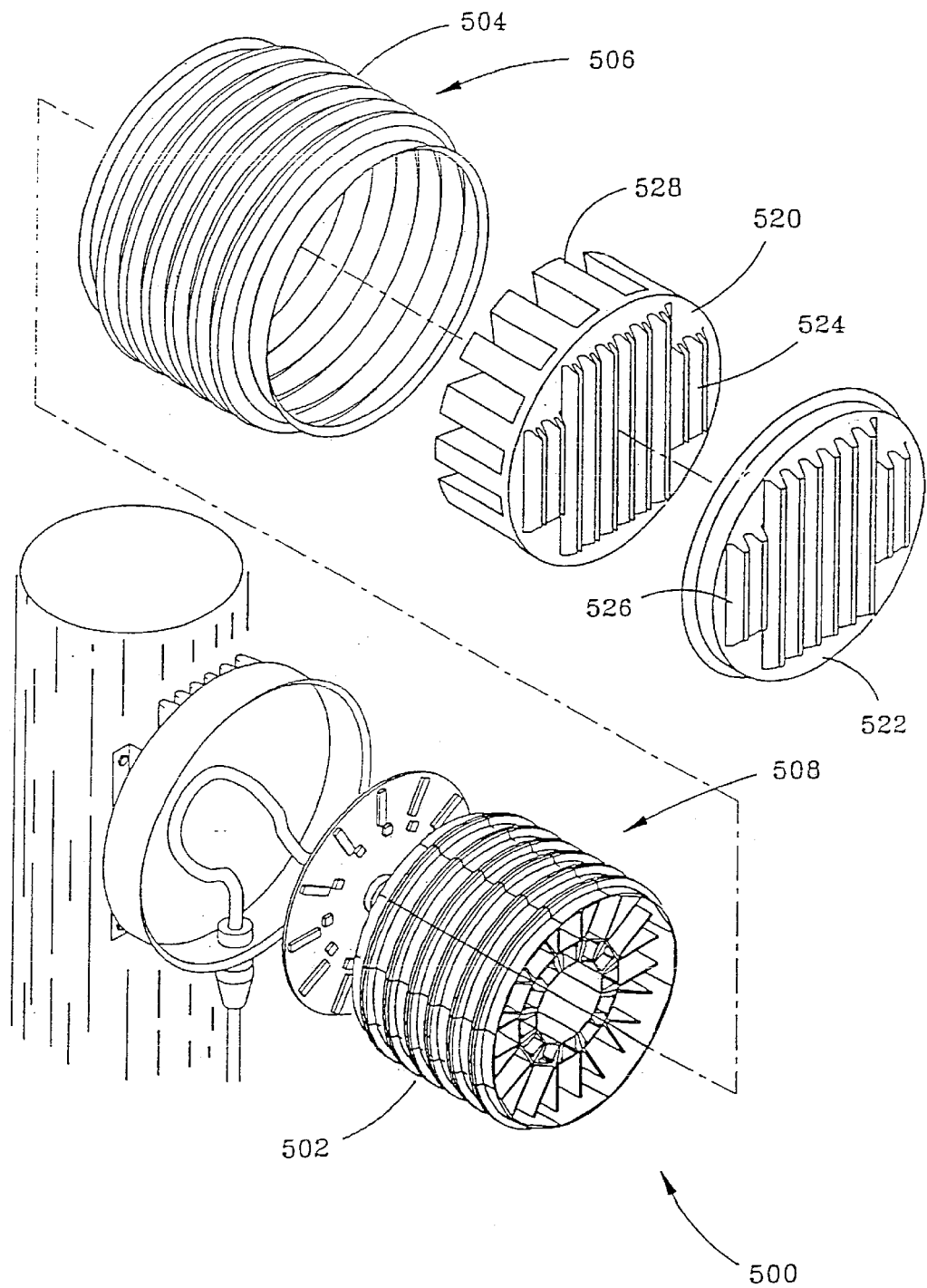
FIG. 21 is an exploded view of a preferred below-ground cylindrical repeater housing.
Figure 22A:
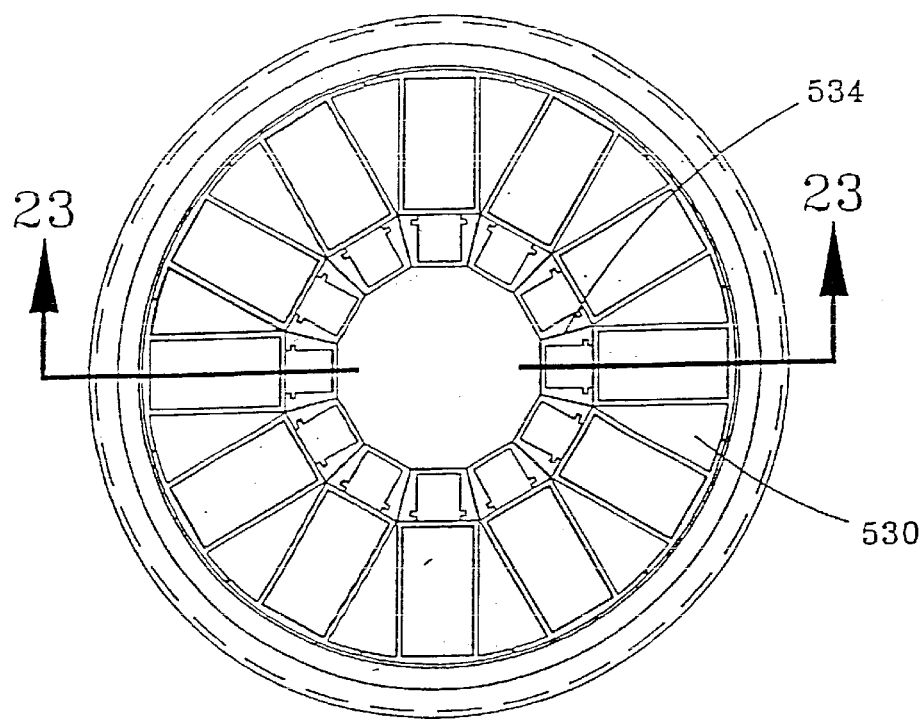
FIGS. 22a and 22b are respectively plan views of the below-ground repeater housing without its cover and the bottom side of the cover.
Figure 22B:
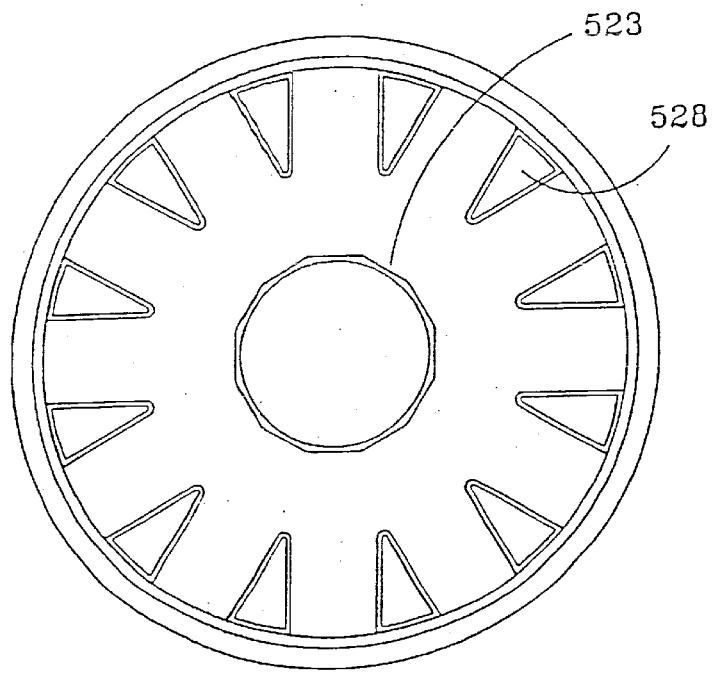

As shown in FIGS. 21 through 23, below-ground cylindrical repeater housing 500 is similar to the above ground version except that a) the fin structure is formed circumferentially around the enclosure, rather than axially, to conform to the fact that hot air rises and that b) solar loading is not a concern. As shown, the thermal chassis' extrusion pattern includes a plurality of circumferential corrugations, or fins, 502 that match the shell's circumferential corrugations 504. With a circumferential fin/corrugation pattern, the shell cannot be slipped over the thermal chassis. While it is possible, to insert individual thermal sleeves into the shell, some volume and distribution efficiency would be lost. More appealing are the two alternatives of either molding the shell over the chassis or molding the chassis inside the shell. As shown, the shell 506 can be molded over chassis 508.

Figure 24:
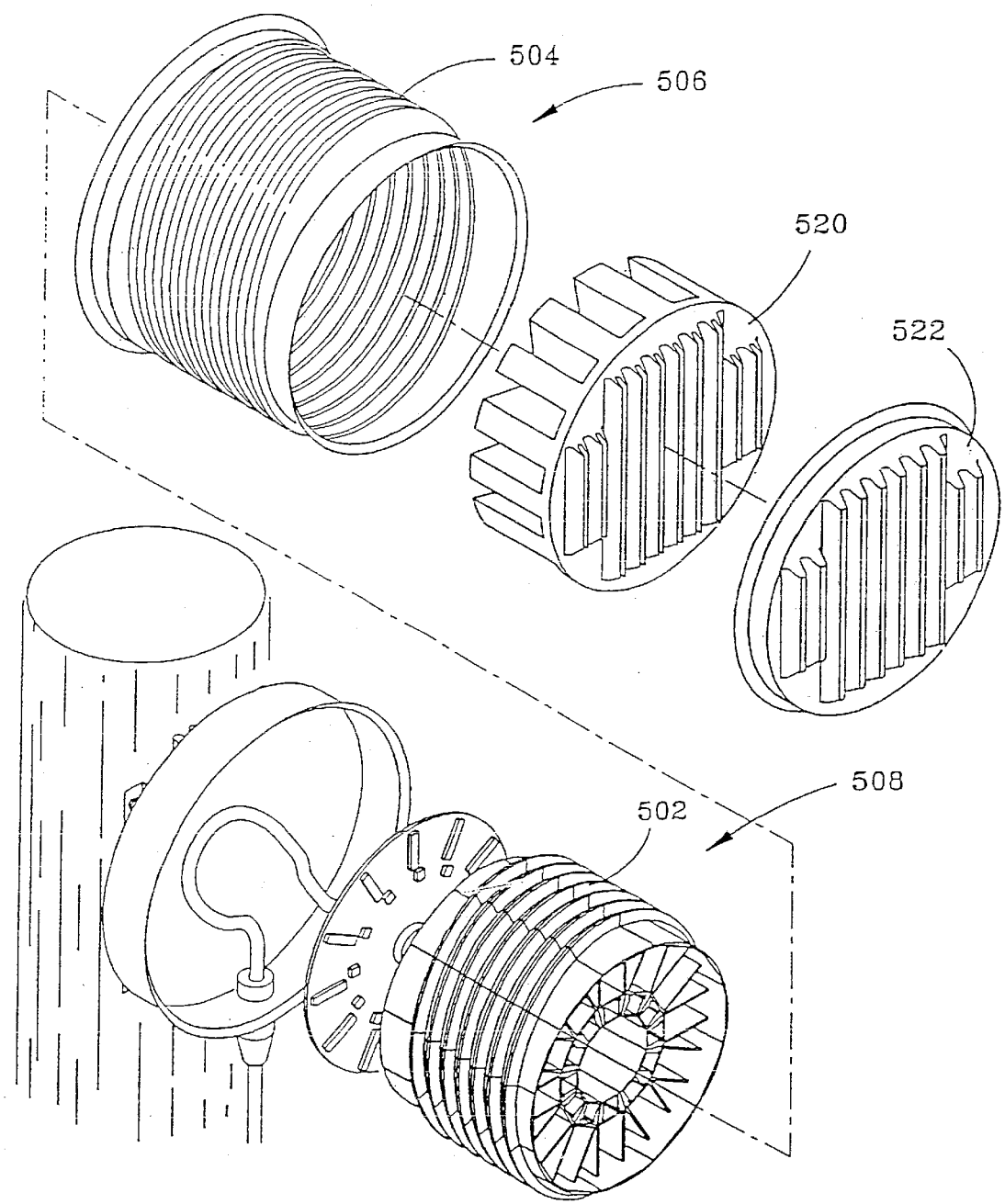
FIG. 24 is an exploded view of a threaded fin below-ground cylindrical repeater housing.

For this horizontal embodiment, an additional manufacturing alternative is illustrated in FIG. 24, in which the circumferential corrugations 504 are inclined from the axis of the cylinder to form threads and the fins 502 on the chassis are similarly inclined. With these matched threads, a chassis and an outer shell can be mated by screwing them together. If the chassis and shell are also tapered, the threaded and tapered components can be assembled in a manner and with the benefits discussed for the tapered vertical cylinder embodiment.

The absence of solar loading underground provides an opportunity to use expanded surfaces on both ends of the repeater housing. As illustrated in FIG. 21, a thermal interface member 520, formed from a suitable thermally conductive material such as aluminum or thermally conductive plastic, transfers waste heat from the chassis to the front access cover 522. The exterior of interface member 520 has fins 524 that fit within corrugations 526 formed in access cover 522. The interior surface of interface member 520, illustrated in plan view in FIG. 22b, has formed on it triangularly shaped thermal conductors 528 that fit within mating triangular slots 530, illustrated in FIG. 22a, in the thermal chassis and implements twelve sets of overlapping thermal joints to transfer waste heat from the chassis to the access cover. Similarly, a twelve faced ring 523 is formed about the center of interface member 520 to form an additional thermal interface joint with the interior twelve sided surface formed by the juncture 534 of the individual thermal sleeves that combine to form the chassis.

Figures 23A, 23B:
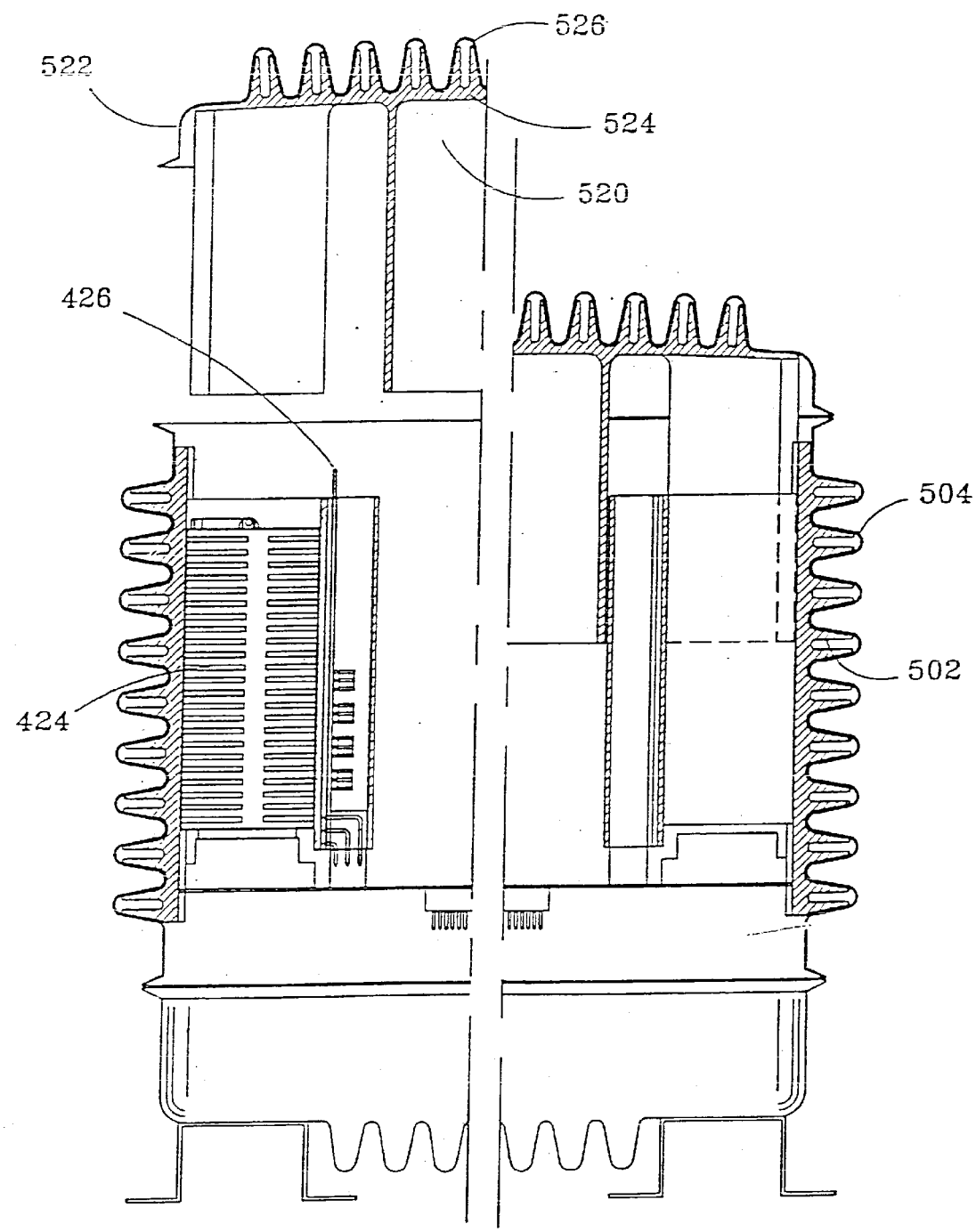
FIGS. 23a and 23b are partial sectional views showing the below-ground cylindrical repeater housing in its uncovered and covered configurations, respectively.

The side profile of these overlapping thermal joints is illustrated in FIG. 23a where the access cover is removed in FIG. 23b where the access cover is in place. For purposes of clarity, the base is shown in a side, rather than a sectional view, but would incorporate a similar interface structure for transferring heat to the mounting bracket. Although this interface member is used in this embodiment to transfer heat to the front access cover, similar interface members, utilizing overlapping and/or interdigitated thermal transfer joints, can be used to move heat to other regions within and without repeater housings, certainly including to the repeater housing base as anticipated in the preceding discussion of the vertical cylinder embodiment.

While several illustrative embodiments of the invention have been shown and described, numerous variations and alternate embodiments will occur to those skilled in the art. For example, although the invention was discussed in the context of the cylindrical SPC 7000 type enclosure, the principles are equally applicable to other housing shapes, rectangular, for example. Although repeater housings for 8 and 12 239 mini and double wide repeaters have been illustrated, the invention can be applied to repeater housings intended for greater and smaller repeater quantities and for other repeater types such as the type 400. Although the direct access voltage surge protector design has been shown in association with the thermal elements of the invention, such direct access protector designs are expected to find application in repeater housings where thermal enhancement is not required, but improved access could be of value. Such variations and alternate embodiments are contemplated, and can be made without departing from the spirit and scope of the invention as defined in the appended claims.

I claim:

1. A passively cooled repeater housing for use in a telecommunication network's wire transmission local loop outside plant to house a plurality of field replaceable, plug-in, standardized repeater modules that generate waste heat and at least one field replaceable, plug-in voltage protector assembly, the repeater housing comprising:

an environmental enclosure;

a plurality of repeater mounting slots inside the environmental enclosure which removably receive the plurality of repeater modules, wherein at least one repeater module is removable from its corresponding one of the plurality of repeater mounting slots by pulling the at least one repeater module in a first direction;

at least one voltage protector assembly mounting slot inside the environmental enclosure which removably receives at least one voltage protector assembly, wherein the at least one voltage protector assembly is removable from its corresponding voltage protector assembly mounting slot by pulling the at least one voltage protector assembly in the first direction;

wherein the plurality of repeater mounting slots and the at least one voltage protector assembly slot are disposed and arranged such that a voltage protector assembly is installable and removable from its corresponding voltage protector assembly mounting slot without removal of the repeater module protected by the voltage protector assembly from its corresponding repeater module mounting slot.

2. The repeater housing of claim 1, wherein each voltage protector assembly is installable and removable from its corresponding voltage protector assembly mounting slot without removal of any of the plurality of the repeater modules from their corresponding repeater module mounting slots.

3. The repeater housing of claim 2, wherein each of the plurality of repeater modules is installable and removable from its corresponding one of the plurality of repeater module mounting slots without removal of any voltage protector assembly from its corresponding voltage protector mountings lot.

4. The repeater housing of claim 1, wherein each of the plurality of repeater modules is installable and removable from its corresponding one of the plurality of repeater module mounting slots without removal of an associated voltage protector assembly from its corresponding voltage protector assembly mounting slot.

5. The repeater housing of claim 1, and further comprising a plurality of repeater connectors which electrically connect to the plurality of repeater modules when the plurality of repeater modules are received within the plurality of repeater mounting slots.

6. The repeater housing of claim 5, and further comprising at least one voltage protector assembly connector which electrically connects to the at least one voltage protector assembly when the at least one voltage protector assembly is received within its corresponding voltage protector assembly mounting slot.

7. The repeater housing of claim 6, wherein each voltage protector assembly connector is electrically connected to at least one of the plurality of repeater module connectors, wherein a voltage protector assembly plugged into its corresponding voltage protector assembly connector provides voltage surge protection to any repeater modules that are plugged-into repeater module connectors which are electrically connected to the corresponding voltage protector assembly connector.

8. The repeater housing of claim 7, wherein a voltage protector assembly is removable from its corresponding voltage protector assembly connector and voltage protector assembly mounting slot without disrupting the function of a repeater module protected by the voltage protector assembly when the repeater module is received within its corresponding repeater mounting slot and is electrically connected to its corresponding eater connector.

9. The repeater housing of claim 1, wherein the at least one voltage protector assembly includes a printed circuit board and at least one voltage protector element mounted on the printed circuit board.

10. The repeater housing of claim 9, and further comprising the at least one voltage protector assembly.

11. The repeater housing of claim 10, and further comprising the plurality of repeater modules.

12. The repeater housing of claim 10, wherein the environmental enclosure further includes at least one cover which is removable to provide field replaceable, plug-in access to at least one of the plurality of repeater modules and to at least one voltage protector assembly.

* * * * *

UNITED STATES PATENT AND TRADEMARK OFFICE
CERTIFICATE OF CORRECTION

PATENT NO.   : 6,798,878 B2
DATED        : September 28, 2004
INVENTOR(S)  : Erich K. Laetsch It is certified that error appears in the above-identified patent and that said Letters Patent is hereby corrected as shown below:

Column 1,
Line 10, delete "tiled" and insert -- filed --.

Column 20,
Line 50, delete "eater" and insert -- repeater --.

Signed and Sealed this

Fifth Day of April, 2005

JON W. DUDAS
*Director of the United States Patent and Trademark Office*